US008829784B2

(12) United States Patent
Inoue et al.

(10) Patent No.: US 8,829,784 B2
(45) Date of Patent: Sep. 9, 2014

(54) SURFACE LIGHT SOURCE DEVICE, LIGHTING DEVICE, AND BACKLIGHT DEVICE

(75) Inventors: Hiroyasu Inoue, Tokyo (JP); Toshihiko Hori, Tokyo (JP); Kenichi Harai, Tokyo (JP)

(73) Assignee: Zeon Corporation, Tokyo (JP)

( * ) Notice: Subject to any disclaimer, the term of this patent is extended or adjusted under 35 U.S.C. 154(b) by 171 days.

(21) Appl. No.: 13/375,039

(22) PCT Filed: Jun. 11, 2010

(86) PCT No.: PCT/JP2010/059905
§ 371 (c)(1),
(2), (4) Date: Nov. 29, 2011

(87) PCT Pub. No.: WO2010/143706
PCT Pub. Date: Dec. 16, 2010

(65) Prior Publication Data
US 2012/0068596 A1    Mar. 22, 2012

(30) Foreign Application Priority Data

Jun. 11, 2009 (JP) .................................. 2009-139813
Jun. 17, 2009 (JP) .................................. 2009-144127

(51) Int. Cl.
*H01J 1/62*   (2006.01)
*H01J 63/04*  (2006.01)
*H01L 51/52*  (2006.01)
*G02B 5/02*   (2006.01)

(52) U.S. Cl.
CPC ........ *H01L 51/5275* (2013.01); *H01L 51/5271* (2013.01); *H01L 51/5293* (2013.01); *G02B 5/0231* (2013.01)
USPC . 313/504; 313/506; 362/311.02; 362/311.06; 362/311.09; 362/339; 359/529; 359/530; 257/40

(58) Field of Classification Search
USPC ............... 313/504, 506; 362/311.02, 311.06, 362/311.09, 339; 359/529, 530; 257/40
See application file for complete search history.

(56) References Cited

U.S. PATENT DOCUMENTS 5,898,523 A *  4/1999  Smith et al. .................... 359/530
7,710,031 B2   5/2010  Kashiwagi et al.
(Continued)

FOREIGN PATENT DOCUMENTS

| JP | 8-83688 A | 3/1996 |
| JP | 2002-237381 A | 8/2002 |

(Continued)

OTHER PUBLICATIONS

International Search Report for International Patent Application No. PCT/JP2010/059905; mailed on Aug. 24, 2010.
Japanese Written Opinion for International Patent Application No. PCT/JP2010/059905; mailed on Aug. 24, 2010.

*Primary Examiner* — Nimeshkumar Patel
*Assistant Examiner* — Thomas A Hollweg
(74) *Attorney, Agent, or Firm* — Birch, Stewart, Kolasch & Birch, LLP

(57) ABSTRACT

A surface light source device includes an organic electroluminescent element including a luminescent layer and a light-emitting surface structure layer disposed on one of the surfaces of the organic electroluminescent element. In the surface light source device, the light-emitting surface structure layer includes a concave-convex structure provided on a surface thereof on the side toward a device light-emitting surface, and the concave-convex structure includes a plurality of concave portions having oblique surfaces and flat portions disposed around the concave portions. The flat portions and/or the concave portions have a size difference in one or more of their width, height, depth, and spacing, the size difference being larger than the difference that causes interference of one or both of emitted light and reflected light.

8 Claims, 14 Drawing Sheets

(56) References Cited

U.S. PATENT DOCUMENTS

| | | | |
|---|---|---|---|
| 2003/0057417 A1* | 3/2003 | Lee et al. | 257/40 |
| 2005/0212989 A1* | 9/2005 | Kashiwagi et al. | 349/56 |
| 2008/0119583 A1* | 5/2008 | Jones et al. | 522/113 |
| 2009/0230415 A1 | 9/2009 | Ide et al. | |

FOREIGN PATENT DOCUMENTS

| | | |
|---|---|---|
| JP | 2003-59641 A | 2/2003 |
| JP | 3114467 U | 10/2005 |
| JP | 2007-115645 A | 5/2007 |
| WO | WO 2004/017106 A1 | 2/2004 |

* cited by examiner

SURFACE LIGHT SOURCE DEVICE, LIGHTING DEVICE, AND BACKLIGHT DEVICE

TECHNICAL FIELD

The present invention relates to a surface light source device, a lighting device provided with the surface light source device, and a backlight device provided with the surface light source device.

BACKGROUND ART

The luminescent bodies of organic electroluminescent elements (hereinafter may be referred to as "organic EL elements") can be formed in a planar shape, and the color of light emitted therefrom can be white or a color close to white. Therefore, it is contemplated that such organic EL elements are used as light sources of lighting devices for illuminating areas in living environments etc. or in applications for backlights of display devices.

As an example of the organic EL elements used in lighting applications, white organic EL elements are being manufactured. Many of such white elements are of the stacked or tandem type in which luminescent layers that generate light with complimentary colors are stacked. The stacks of such luminescent layers are mainly stacks of yellow/blue luminescent layers or green/blue/red luminescent layers.

However, currently known organic EL elements are unsatisfactory in terms of efficacy for the above-described lighting applications. Therefore, there is a necessity for improving the light extraction efficiency of such organic EL elements.

One known method for improving the light extraction efficiency of organic EL elements is to provide various structures on their light-extraction substrates. For example, it is proposed to provide prisms containing a fluorescent compound on the light-emitting surface of a light source device (Patent Document 1). It is also proposed to provide a micro-lens array on the light-emitting surface of a light source device (Patent Document 2). With these structures, light can be gathered in a favorable manner, and the efficiency is thereby improved.

However, when any of these structures is adopted for the above-described lighting organic EL element of the stacked type and a concave-convex structure such as prisms is provided on the light-emitting surface of the light source device, the apex portions of the concave-convex structure are easily broken off. Therefore such a structure causes difficulty in increasing the mechanical strength of the device.

One possible measure to improve the mechanical strength of the device is to employ, as the concave-convex structure, a structure including a plurality of concave portions having oblique surfaces and flat portions disposed around the concave portions. With such a structure, the mechanical strength of the light-emitting surface can be improved because of the structure of the flat portions.

However, with the aforementioned structure, even a slight insufficiency in accuracy of, e.g., the height of the flat portions may cause interference of reflected light due to the slight differences in height of the flat portions. As shown in FIG. 15, such interference may cause a rainbow unevenness observed on an reflected image on a screen. Such a rainbow unevenness significantly reduces the quality of the light source. Although such a rainbow unevenness may be eliminated by extremely increasing the accuracy of the mold for forming the concave-convex structure, mass production with such high accuracy is difficult and causes an increase in manufacturing cost.

LIST OF PRIOR ART DOCUMENTS

Patent Document

Patent Document 1: Japanese Patent Application Laid-Open No. 2002-237381 A
Patent Document 2: Japanese Patent Application Laid-Open No. 2003-59641 A

SUMMARY OF THE INVENTION

Problem to be Solved by the Invention

It is an object of the present invention to provide a surface light source device, a lighting device, and a backlight device that have high light extraction efficiency and high mechanical strength, can reduce the occurrence of the rainbow unevenness, and can be easily manufactured.

Solution to Problem

The present inventors have made intensive studies to solve the above problems and found out that the occurrence of the rainbow unevenness can be rather suppressed by forming flat portions that intentionally have a variety in their shapes in a periodical or random manner on the light-emitting surface of a surface light source device such that the variety is greater than the difference causing interference of one or both of emitting light and reflected light. The present invention has been completed based on the above-described finding.

Accordingly, the present invention provides the following [1] to [7].

[1] A surface light source device comprising: an organic electroluminescent element including a luminescent layer; and a light-emitting surface structure layer disposed in contact with at least one of surfaces of the organic electroluminescent element, wherein:

the light-emitting surface structure layer includes a concave-convex structure provided on a surface thereof on a side toward a light-emitting surface of the device, the concave-convex structure includes a plurality of concave portions having oblique surfaces and flat portions disposed around the concave portions, and the flat portions and/or the concave portions have a size difference in one or more of a width, a height, a depth, and a spacing thereof, the size difference being larger than a difference that causes interference of one or both of emitted light and reflected light.

[2] The surface light source device, wherein in a cross-section obtained by cutting the light-emitting surface structure layer along a plane that is perpendicular to the device light-emitting surface and passes through the concave portions, the device light-emitting surface includes a repeating unit composed of two or more concave portions and two or more flat portions.

[3] The surface light source device, wherein, when the concave-convex structure is observed in a direction perpendicular to the device light-emitting surface, a ratio of an area occupied by the flat portions to the sum of the area occupied by the flat portions and an area occupied by the concave portions is 10 to 75%.

[4] A lighting device comprising a surface light source device according to one of [1] to [3].

[5] A backlight device comprising a surface light source device according to one of [1] to [3].

[6] A surface light source device comprising: an organic electroluminescent element including a luminescent layer; and a light-emitting surface structure layer disposed in contact with at least one of surfaces of the organic electroluminescent element, wherein:

the light-emitting surface structure layer includes a concave-convex structure provided on a surface thereof on a side toward a light-emitting surface of the device, the concave-convex structure includes a plurality of concave portions having oblique surfaces and flat portions disposed around the concave portions, and the flat portions and/or the concave portions have a size difference in one or more of a width, a height, a depth, and a spacing thereof, the size difference being larger than a difference that causes interference of emitted light.

[7] The surface light source device according to [1] or [6], wherein the organic electroluminescent element includes two or more electrode layers and a luminescent layer that is disposed between the electrode layers and emits light when a voltage is applied from the electrode layers, and each of the two or more electrode layers is a layer consisting of a transparent electrode.

Advantageous Effects of Invention

The surface light source device of the present invention has high light extraction efficiency and high mechanical strength, can reduce the occurrence of the rainbow unevenness on the light-emitting surface, and can be easily manufactured. Therefore, the surface light source device is useful as the light source of a lighting device and the backlight of a display device such as a liquid crystal display device.

The lighting device and backlight device of the present invention each include the surface light source device of the present invention. Therefore, the lighting device and backlight device have high light extraction efficiency and high mechanical strength, can reduce the occurrence of the rainbow unevenness on their light-emitting surfaces, and can be easily manufactured.

DESCRIPTION OF EMBODIMENTS

First Embodiment

The present invention will be described in more detail with reference to the drawings.

A surface light source device of the present invention includes: an organic EL element including a luminescent layer; and a light-emitting surface structure layer that is disposed in contact with at least one surface of the organic EL element and defines a concave-convex structure on the surface on a light-emitting surface side of the device.

The device light-emitting surface is the light-emitting surface of the surface light source device, i.e., the light-emitting surface through which the light from the surface light source device is emitted to the outside of the device. The device light-emitting surface is a surface parallel to the luminescent layer of the organic EL element and is parallel to the principal surface of the surface light source device. However, in a microscopic sense, the surfaces of concave portions described later may form a non-parallel angle with respect to the luminescent layer. Hereinafter, unless otherwise specifically mentioned, the phrase "parallel (or perpendicular) to the device light-emitting surface" simply means that an object is parallel (or perpendicular) to the device light-emitting surface with the concave portions being neglected. Unless otherwise mentioned, a description will be given of the surface light source device placed with its device light-emitting surface being parallel to the horizontal direction and facing upward.

In the present invention, when components are "parallel" or "perpendicular" to each other, a deviation in the range in which the effects of the present invention are not impaired may be present. For example, a tolerance of ±5° with respect to the parallel or perpendicular angle may be allowable.

Figure 1:
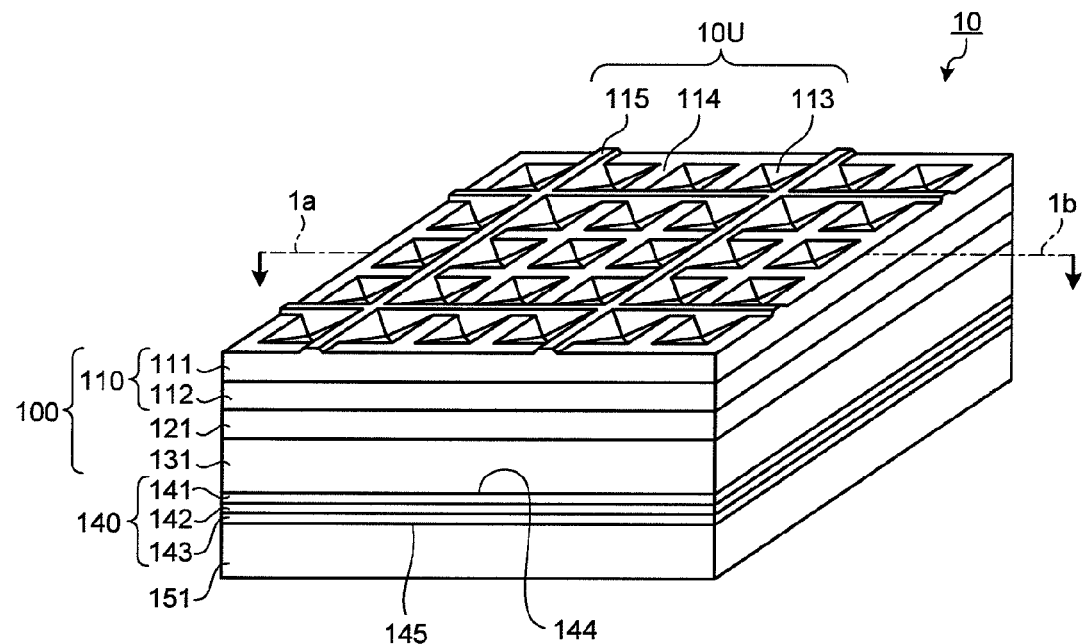
FIG. 1 is a perspective view schematically showing a surface light source device according to a first embodiment of the present invention.
Figure 2:
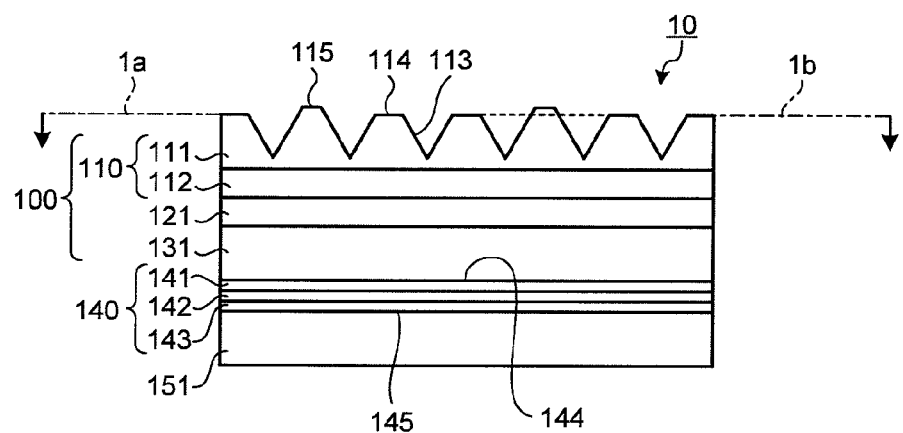
FIG. 2 is a cross-sectional view showing a cross-section obtained by cutting the surface light source device shown in FIG. 1 along a plane that passes through a line 1a-1b in FIG. 1 and is perpendicular to a device light-emitting surface.

FIG. 1 is a perspective view schematically showing the surface light source device according to the first embodiment of the present invention. In the first embodiment, the surface light source device 10 is a device including a device light-emitting surface 10U and having a flat rectangular plate-like structure. FIG. 2 is a cross-sectional view showing a cross-section obtained by cutting the surface light source device 10 shown in FIG. 1 along a plane that passes through a line 1a-1b in FIG. 1 and is perpendicular to the device light-emitting surface.

The surface light source device 10 includes an organic EL element 140 and a light-emitting surface structure layer 100 disposed in contact with a surface 144 of the organic EL element 140. The surface 144 is toward the device light-emitting surface 10U. The surface light source device 10 further includes, as an optional component, a sealing substrate 151 disposed on a surface 145 of the organic EL element 140. The surface 145 is on the side opposite to the device light-emitting surface 10U.

The organic EL element 140 includes a first electrode layer 141, a luminescent layer 142, and a second electrode layer 143. In the first embodiment, the first electrode layer 141 is a transparent electrode, and the second electrode layer 143 is a reflecting electrode. With this configuration, the light from the luminescent layer 142 passes through the first electrode layer 141, or is reflected from the second electrode layer 143 and then passes through the luminescent layer 142 and the first electrode layer 141, whereby the light can be directed toward the light-emitting surface structure layer 100.

The light-emitting surface structure layer 100 includes: a multi-layered body 110 including a concave-convex structure layer 111 and a substrate film layer 112; a glass substrate 131 serving as a substrate; and a bonding layer 121 that bonds the multi-layered body 110 to the glass substrate 131.

The concave-convex structure layer 111 is located at the top surface of the surface light source device 10 (i.e., the outermost layer of the surface light source device 10 that is on the light-emitting surface side). The concave-convex structure layer 111 has a concave-convex structure including a plurality of concave portions 113, flat portions 114 disposed around the concave portions 113, and flat portions 115 different in height from the flat portions 114 (i.e., the position in a height direction when the extending direction of the device light-emitting surface is assumed to be a horizontal direction). This concave-convex structure defines the device light-emitting surface 10U. In a macroscopic sense, i.e., with the irregularities due to the concave portions 113 and due to the differences in height between the flat portions 114 and 115 being neglected, the device light-emitting surface 10U is a flat surface parallel to other layers, such as the flat portions 114 and 115 and the glass substrate 131, in the device. However, in a microscopic sense, the device light-emitting surface 10U is a concave-convex surface including oblique surfaces defined by the concave portions 113. In the present application, the figures are schematic diagrams, and illustrate only a small number of concave portions on the device light-emitting surface. However, in an actual device, a much larger number of concave portions may be provided on one device light-emitting surface.

(Organic EL Element)

In the present invention, the organic EL element may be an element including two or more electrode layers and a luminescent layer that is disposed between these electrode layers and emits light when a voltage is applied from the electrode layers, as exemplified as the organic EL element 140.

Generally, an organic EL element has a structure in which layers such as electrode layers and a luminescent layer constituting the element are formed on a substrate and a sealing member that covers these layers is then provided so that the layers such as the luminescent layer are sealed with the substrate and the sealing member. Generally, a device that emits light from its substrate side is referred to as a bottom emission type, and a device that emits light from its sealing member side is referred to as a top emission type. The surface light source device of the present invention may be any of the top emission type and bottom emission type. When the surface light source device is of the bottom emission type, a combination including a substrate used to form layers and, if necessary, an optional layer forms the light-emitting surface structure layer. When the surface light source device is of the top emission type, a combination including a structural member on the light-emitting surface side, such as the sealing member, and, if necessary, an optional layer forms the light-emitting surface structure layer.

In the present invention, no particular limitation is imposed on the luminescent layer constituting the organic EL element, and any of the known luminescent layers may be suitably selected. The number of types of luminescent materials in the luminescent layer is not limited to one, and also the number of luminescent layers is not limited to one. In order to adapt to the use of the device as a light source, the luminescent layer may be a single layer or a combination of a plurality of layers. In this manner, white light or light of a color close to white can be emitted.

In addition to the luminescent layer, the organic EL element may further include another layer such as a hole injection layer, a hole transport layer, an electron transport layer, an electron injection layer, and a gas barrier layer that are disposed between the electrode layers. The organic EL element may further include any optional components such as wiring leads for supplying an electric current to the electrode layers and a peripheral structure for sealing the luminescent layer.

No particular limitation is imposed on the electrode layers of the organic EL element, and any of the known electrode layers may be appropriately selected. As in the organic EL element 140 in the first embodiment, when a transparent electrode is employed as the electrode layer on a side toward the light-emitting surface structure layer and a reflecting layer is employed as the electrode layer on the opposite side, the organic EL element may be configured to emit light toward the light-emitting surface structure layer. When transparent electrode layers are employed as both the electrode layers, the organic EL element may be an element in which light is emitted from the light-emitting surface structure layer side and also from the side opposite thereto (an element of so-called see-through type). In the case in which both the electrode layers are transparent electrodes, when a reflecting member or a scattering member (such as a white scattering member disposed through an air layer) is provided on the side opposite to the light-emitting surface structure layer, the organic EL element may be configured to emit light toward the light-emitting surface structure layer.

No particular limitation is imposed on the materials for forming the electrode layers and the layers disposed therebetween. Specific examples of such materials are as follows.

Examples of the material for the transparent electrode may include ITO.

Examples of the material for the hole injection layer may include starburst aromatic diamine compounds.

Examples of the material for the hole transport layer may include triphenyldiamine derivatives.

Examples of the host material for a yellow luminescent layer may also include triphenyldiamine derivatives.

Examples of the dopant material for the yellow luminescent layer may include tetracene derivatives.

Examples of the material for a green luminescent layer may include pyrazoline derivatives.

Examples of the host material for a blue luminescent layer may include anthracene derivatives, and examples of the dopant material for the blue luminescent layer may include perylene derivatives.

Examples of the material for a red luminescent layer may include europium complexes.

Examples of the material for the electron transport layer may include aluminum quinoline complexes (Alq).

Examples of the material for a cathode may include a stack of lithium fluoride and aluminum layers that is produced by sequential vacuum deposition.

The aforementioned luminescent layer and other luminescent layers may be suitably combined to obtain a stacked or tandem type luminescent layer that generates light with complementary colors. The combination of complementary colors may be yellow/blue, green/blue/red, etc.

(Light-Emitting Surface Structure Layer)

In the present invention, the light-emitting surface structure layer may be composed of a plurality of layers, as exemplified as the light-emitting surface structure layer 100, but may be composed of a single layer. It is preferable, from the viewpoint of easily obtaining a light-emitting surface structure layer having the desired characteristics, to use a plurality of layers. For example, as in the light-emitting surface structure layer 100, the multi-layered body including a combination of the concave-convex structure layer and the substrate film layer may be used. In this manner, a high-performance light-emitting surface structure layer can be easily obtained.

The resin composition constituting the concave-convex structure layer and the substrate film may be a composition containing a transparent resin. The term "transparent" in the transparent resin means that it has a light transmittance suitable for use in optical members. In the present invention, each of the layers constituting the light-emitting surface structure layer may have a light transmittance suitable for use in optical members, and the total light transmittance of the light-emitting surface structure layer as a whole may be 80% or larger.

No particular limitation is imposed on the types of the transparent resins contained in the resin compositions. Any of various resins that can form a transparent layer may be used therefor. Examples of such a resin may include thermoplastic resins, thermosetting resins, ultraviolet curable resins, and electron ray-curable resins. Of these, thermoplastic resins can be easily deformed by heat, and ultraviolet curable resins have high curability and high efficiency. Therefore, these resins are preferred because the concave-convex structure layer can be efficiently formed. Examples of the thermoplastic resins may include polyester-, polyacrylate-, and cycloolefin polymer-based resins. Examples of the ultraviolet curable resins may include epoxy-, acrylic-, urethane-, ene/thiol-, and isocyanate-based resins. Resins having a plurality of polymerizable functional groups may be preferably used as the aforementioned resins.

A material having high hardness after curing is preferred as the material for the concave-convex structure layer included in the multi-layered body because such a material can easily form the concave-convex structure of the device light-emitting surface and can easily provide abrasion resistance of the concave-convex structure. More specifically, it is preferable to use a material having a pencil hardness of HB or higher when a resin layer having a thickness of 7 μm is formed on a substrate with no concave-convex structure provided thereon. A material having a pencil hardness of H or higher is more preferred, and a material having a pencil hardness of 2H or higher is still more preferred. In order to easily handle the multi-layered body during the formation of the concave-convex structure layer and/or the completed multi-layered body, a material having some degree of flexibility is preferably used as the material for the substrate film layer. The use of a combination of the aforementioned materials allows a multi-layered body that is easy to handle and has high durability to be obtained, and therefore a high-performance surface light source device can be easily manufactured. Such a combination of materials may be obtained by appropriately selecting, as the resins contained in the materials, the transparent resins exemplified above. More specifically, a ultraviolet curable resin such as acrylate may be used as the transparent resin constituting the material for the concave-convex structure layer, and a film made of an alicyclic olefin polymer (such as ZEONOR Film which will be described later) or a polyester film may be used as the transparent resin constituting the material for the substrate film. A preferred combination of materials may thereby be obtained.

When the light-emitting surface structure layer includes a concave-convex structure layer and a substrate film layer as in the light-emitting surface structure layer 100, it is preferable that the refractive index of the concave-convex structure layer be close to that of the substrate film as much as possible. The difference in refractive index is preferably 0.1 or smaller and more preferably 0.05 or smaller.

The resin composition used as the material for each of the constituent layers, such as the concave-convex structure layer and the substrate film layer, of the light-emitting surface structure layer may contain an optional component, if necessary. Examples of the optional component may include additives such as antidegradants such as phenol-based and amine-based antidegradants; antistatic agents such as surfactant-based and siloxane-based antistatic agents; and light-proofing agents such as triazole-based and 2-hydroxybenzophenone-based light-proofing agents.

In the present invention, no particular limitation is imposed on the thickness of the concave-convex structure layer, but the thickness is preferably 1 to 70 μm. The thickness of the concave-convex structure layer is the distance between its surface on the substrate side on which the concave-convex structure is not formed and the flat portions of the concave-convex structure. The thickness of the substrate film layer is preferably 20 to 300 μm.

In the present invention, the light-emitting surface structure layer may further include a substrate such as the glass substrate 131 in the light-emitting surface structure layer 100 described above. Having such a substrate, the surface light source device may have stiffness for suppressing warpage. When a substrate having a good ability to seal the organic EL element and easily allowing successive formation of the layers constituting the organic EL element on the substrate in the production process is used as the above-described substrate, the durability of the surface light source device can be improved, and the manufacture of the surface light source device can be facilitated.

Examples of the material constituting the substrate may include, in addition to glass, resins. No particular limitation is imposed on the refractive index of the substrate. The refractive index may be 1.4 to 2.0. In the present invention, no particular limitation is imposed on the thickness of the substrate. The thickness is preferably 0.1 to 5 mm.

The light-emitting surface structure layer may further include a bonding layer interposed between two layers in the light-emitting surface structure layer such as between the multi-layered body and the substrate. An adhesive agent used as the material for the bonding layer is not limited to an adhesive agent in a narrow sense (a so-called hot-melt adhesive agent having a shear storage modulus at 23° C. of 1 to 500 MPa and exhibiting no adhesion at room temperature) but also encompasses a tacky agent having a shear storage modulus at 23° C. of smaller than 1 MPa. Specifically, a adhesive agent having a refractive index close to those of the substrate and the transparent resin layer and having transparency may be appropriately used. More specific examples may include acrylic-based adhesive agents or acrylic-based tacky agents. Preferably, the thickness of the bonding layer is 5 to 100 μm.

(Concave-Convex Structure)

In the present invention, the concave-convex structure on the light-emitting surface structure layer includes a plurality of concave portions including oblique surfaces and flat portions disposed around the concave portions. The "oblique surface" is a surface forming a non-parallel angle with respect to the device light-emitting surface. The surfaces of the flat portions may be surfaces parallel to the device light-emitting surface. In the present invention, the flat portions and/or the concave portions include those in which the difference in one or more of width, height, depth, and spacing (size difference) from others is larger than the difference that causes the interference of one or both of emitted light and reflected light. The aforementioned size difference may be larger than the difference that causes the interference of the emitted light. Since the influence of the reflected light on the rainbow unevenness tends to be larger than the influence of the emitted light, the size difference is preferably larger than the size difference that causes the interference of the reflected light. More preferably, the size difference is larger than the difference that causes the interference of both the emitted light and the reflected light. In the aforementioned size differences, the height is the height of a flat portion, and the depth is the depth of a concave portion (the position thereof in the height direction when the extending direction of the device light-emitting surface is referred to as the horizontal direction). Generally, the width of a flat portion corresponds to the spacing between concave portions, and the spacing between flat portions corresponds to the width of a concave portion. The size difference may be present only in the flat portions, only in the concave portions, or in both the flat portions and the concave portions.

Figure 9:
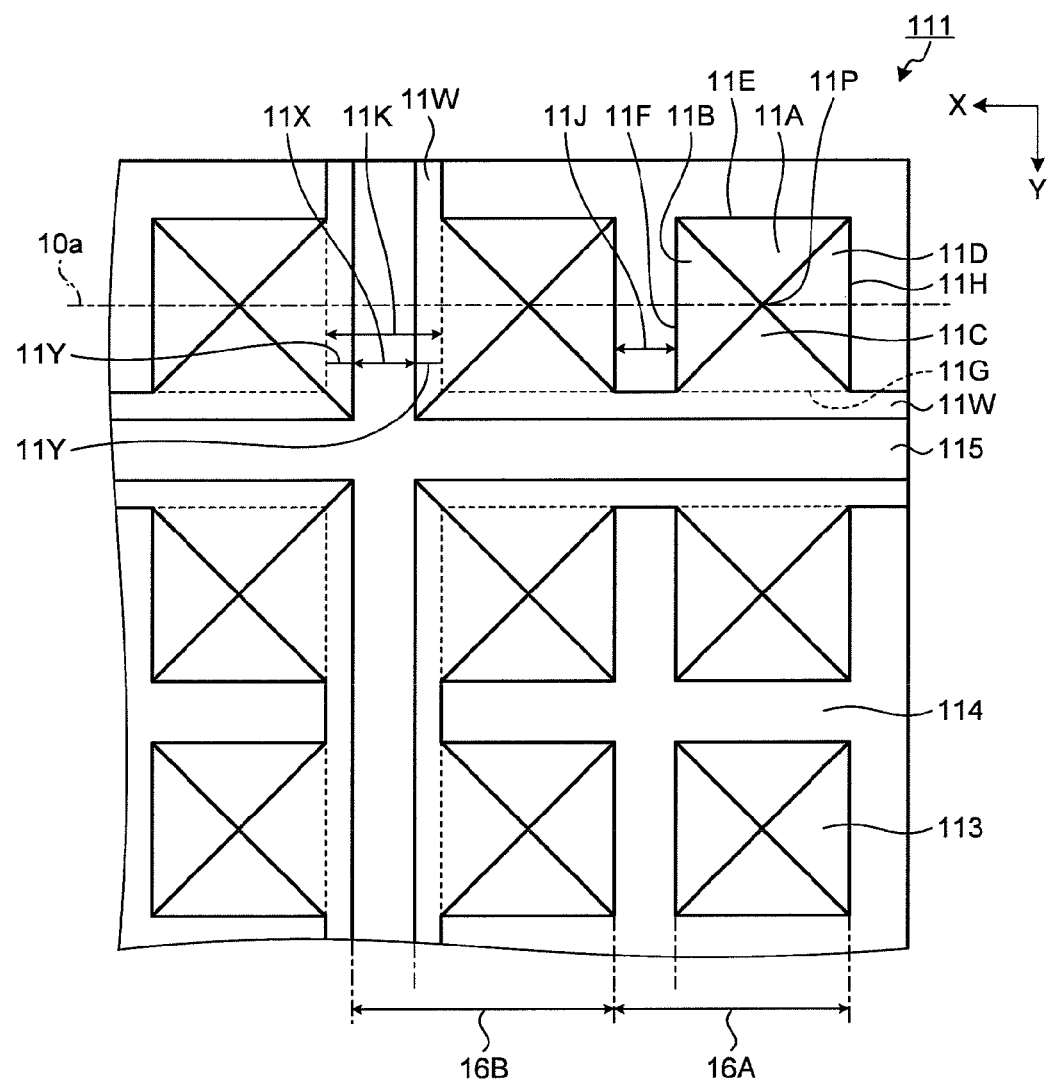
FIG. 9 is an enlarged partial top view illustrating the structure of a device light-emitting surface 10U of the surface light source device 10 shown in FIG. 1.
Figure 10:
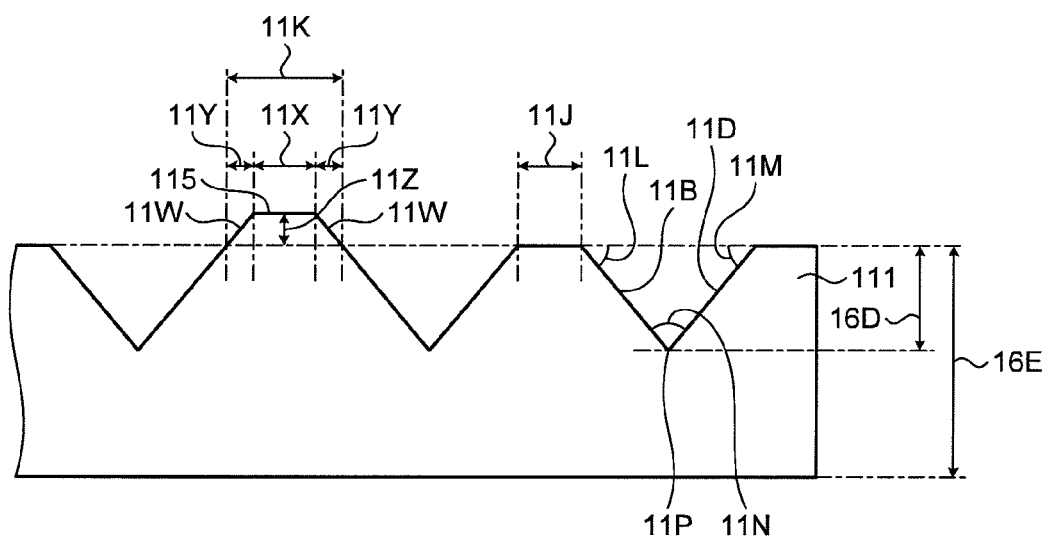
FIG. 10 is a partial cross-sectional view showing a cross-section obtained by cutting a concave-convex structure layer 111 shown in FIG. 9 along a perpendicular plane that passes through a line 10a in FIG. 9.

As an example of the concave-convex structure, the concave-convex structure on the device light-emitting surface of the surface light source device 10 shown in FIGS. 1 and 2 will be described in detail with reference to FIGS. 9 and 10. FIG. 9 is an enlarged partial top view illustrating the structure of the device light-emitting surface 10U of the surface light source device 10 that is defined by the concave-convex structure layer 111. FIG. 10 is a partial cross-sectional view showing a cross-section obtained by cutting the concave-convex structure layer 111 along a perpendicular plane that passes through a line 10a in FIG. 9.

Each of the plurality of concave portions 113 is a regular quadrangular pyramid-shaped recess. Therefore oblique surfaces 11A to 11D of the concave portion 113 have the same shape, and the base edges 11E to 11H form a square. However, since the oblique surface 11C is continuous with an oblique surface 11W extending along a flat portion 115, the base edge 11G of the base edges 11E to 11H does not appear as a structure of the concave-convex structure. In FIG. 9, such base edges are represented by broken lines. The line 10a is a line passing through all the apexes 11P of a row of concave portions 113 and parallel to the base edges 11E and 11G of the concave portions 113.

The concave portions 113 are continuously aligned at regular intervals in two mutually orthogonal alignment directions. One direction X of the two alignment directions is parallel to the base edges 11E and 11G. In the direction X, a plurality of concave portions 113 are aligned with spacings 11J or 11K therebetween. The other direction Y of the two alignment directions is parallel to the base edges 11F and 11H. Also in the direction Y, a plurality of concave portions 113 are aligned with spacings 11J or 11K therebetween. Therefore, the width of the flat portions 114 is 11J, and the total width of a flat portion 115 and a pair of oblique surfaces 11W extending along opposite sides of the flat portion is 11K.

The angles between a flat portion 114 and the oblique surfaces 11A to 11D constituting a concave portion 113 (angles 11L and 11M shown in FIG. 10 for the oblique surfaces 11B and 11D, respectively) are set to, for example, 60°. Therefore, the vertex angle of the regular quadrangular pyramid forming the concave portion 113, i.e., the angle at the apex 11P formed by oblique surfaces facing each other (an angle 11N shown in FIG. 10 for the angle formed by the oblique surfaces 11B and 11D) is also 60°.

In the present embodiment, the width 11J of the flat portions 114 and the width 11X of the flat portions 115 are set to be equal to each other. However, the pitch 16A between two flat portions 114 adjacent to each other and extending parallel to each other and a pitch 16B between a flat portion 114 and a flat portion 115 adjacent to each other and extending parallel to each other are different (different in size) from each other. More specifically, the pitch 16A between two flat portions 114 is equal to the sum of the length of the base edge of the quadrangular pyramid and the width of the flat portion 114. However, since the oblique surfaces 11W are present, the pitch 16B between a flat portion 114 and a flat portion 115 is equal to the sum of the length of the base edge of the quadrangular pyramid, the width of the flat portion 115, and the width 11Y of the oblique surface 11W.

In the present embodiment, the height of the flat portions 114 and the height of the flat portions 115 are also different (different in size). More specifically, the flat portions 115 are present between the oblique surfaces 11W and therefore are located at a level higher than the level of the flat portions 114 by a height 11Z shown in FIG. 10.

Figure 11:
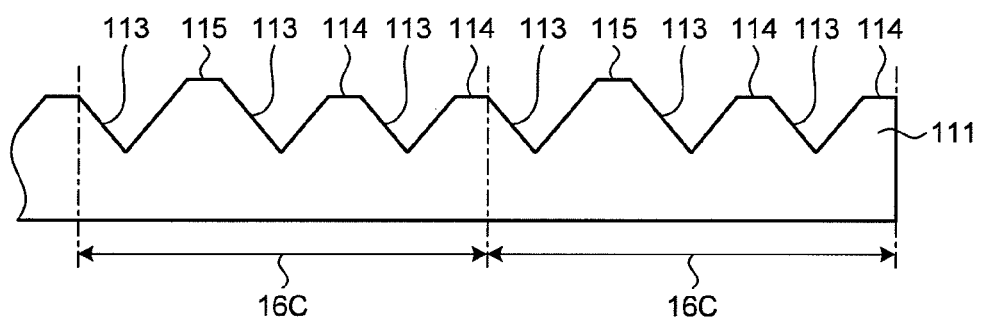
FIG. 11 is a partial cross-sectional view illustrating a larger region of the cross-section shown as the partial cross-sectional view in FIG. 10.

In the present embodiment, two rows of flat portions 114 and one row of flat portions 115 are disposed alternately. Therefore, the light-emitting surface structure layer 111 has a structure in which its cross-section includes repeating units 16C shown in FIG. 11. More specifically, the repeating unit 16C composed of two flat portions 114, one flat portion 115, and the oblique surfaces (including the oblique surfaces 11W) of three concave portions 113 between these flat portions is repeated in the cross-section of the light-emitting surface structure layer 111. Such repetitions may appear on a cross-section perpendicular to the line 10a shown in FIG. 9 and to the device light-emitting surface, as well as on the cross-section passing through the line 10a.

In the present invention, a size difference in one or more of width, height, depth, and spacing that is larger than the difference that causes interference of one or both of emitted light and reflected light is set between the flat portions and/or the concave portions. In the case of interference of emitted light as an example, the size difference larger than the difference that causes the interference is, for example, normally equal to or larger than 0.62 times and preferably equal to or larger than 1.5 times the center wavelength of the light emitted from the surface light source device. When such a size difference is provided, the occurrence of the rainbow unevenness can be suppressed. No particular limitation is imposed on the upper limit of the size difference. Preferably, the upper limit may be equal to or smaller than 60 times the center wavelength of the light emitted from the surface light source device.

The aforementioned numerical range has been verified by the following findings. In a concave-convex structure layer designed such that all the flat portions have the same height, when the height of the flat portions includes an error of 170 nm or larger, interference occurs and the rainbow unevenness is observed. In this case, it has been found out that the occurrence of the rainbow unevenness can be suppressed by intentionally providing a size difference in height equal to or larger than 2 times the minimum error that causes the rainbow unevenness. In addition, in a concave-convex structure layer designed such that all the flat portions have the same height, when the height of the flat portions fluctuates with a standard deviation of $\sigma 1$ nm ($\cong 60$ nm), interference occurs and the rainbow unevenness is observed. In this case, it has been found out that the occurrence of the rainbow unevenness can be suppressed by intentionally providing a size difference in height equal to or larger than $6 \times \sigma 1$ nm (=360 nm). The aforementioned two findings show that the size difference larger than the difference that causes interference of emitted light is equal to or larger than 0.62 times the center wavelength of the light emitted from the surface light source device.

For the same reason, in the case of interference of reflected light, the size difference larger than the difference that causes the interference is normally equal to or larger than 0.62 times and preferably equal to or larger than 1.5 times the center wavelength of the light reflected from the device light-emitting surface toward the outside of the surface light source device. The size difference is normally equal to or smaller than 60 times the center wavelength. However, generally, the light reflected from the device light-emitting surface is natural light and includes any of various wavelengths. Therefore, it is difficult to determine the center wavelength of the reflected light. In view of the fact that the light causing the rainbow unevenness is visible light, 550 nm, which is the center wavelength of visible light, is normally taken as the center wavelength of the reflected light to determine the size difference described above.

The size difference between the flat portions and/or the concave portions may be randomly provided over the entire device light-emitting surface. However, it is preferable in terms of ease of manufacturing that the device light-emitting surface include repeating units on a cross-section such as the repeating units 16C described above. More specifically, it is preferable that repeating units each including two or more concave portions and two or more flat portions having different heights be present on a cross-section.

When the device light-emitting surface of the surface light source device has a structure including a plurality of concave portions and flat portions disposed therearound, light extraction efficiency can be improved, and a change in color tone at different viewing angles can be reduced. In addition, the concave-convex structure is prevented from, for example, being broken off by an external impact, and therefore the mechanical strength of the device light-emitting surface can be improved.

With the surface light source device of the present invention configured as described above, variations in at least one of x- and y-chromaticity coordinates in any directions in a hemisphere on the light-emitting surface can be reduced by half as compared to those which does not have the aforementioned configuration. Therefore, with the surface light source device, a change in color tone at different viewing angles can be suppressed. To measure the variations in chromaticity in all the directions in the hemisphere, for example, a spectral radiance meter is placed on the normal to (in front of) the device light-emitting surface, and a mechanism for rotating the device light-emitting surface from −90 to 90° with respect to the direction of the normal being defined as 0° is provided. In this manner, the emission spectra can be measured in various directions to calculate the chromaticity coordinates, and the variations in the chromaticity coordinates can thereby be calculated.

The light extraction efficiency of the surface light source device can be improved by appropriately adjusting the ratio of the area occupied by the flat portions with respect to the sum of the area occupied by the flat portions and the area occupied by the concave portions when the concave-convex structure layer is observed in a direction perpendicular to the device light-emitting surface (hereinafter this ratio is referred to as a "flat portion ratio"). More specifically, when the flat portion ratio is adjusted to 10 to 75%, favorable light extraction efficiency can be obtained, and the mechanical strength of the device light-emitting surface can be improved.

In the present invention, the concave portions may have, in addition to the pyramid shape described above, for example, a conical shape, a shape of part of a sphere, a groove shape, or a combination of any of these shapes. A pyramid shape or a shape of a combination of a plurality of pyramids is preferred. The pyramid shape may be a quadrangular pyramid shape with a square bottom, as exemplified as the concave portions 113 described above, but the present invention is not limited thereto. The pyramid shape may be any of triangular, pentagonal, and hexagonal pyramid shapes and quadrangular pyramid shapes with non-square bottoms.

The term pyramid used in the present application encompasses not only an ordinary pyramid shape having a sharp apex but also pyramid shapes having rounded apexes and pyramid shapes having flat truncated apexes (such as frustum shapes). For example, although the apexes 11P of the quadrangular pyramids are sharp in the concave portions 113 shown in FIG. 10, the apexes of quadrangular pyramids may have a rounded shape like an apex 61P of a concave portion 613 shown in FIG. 12. As exemplified by concave portions 713 shown in FIG. 13, a flat portion 71P may be provided at the apex of each pyramid to form a flat truncated shape.

Figure 12:
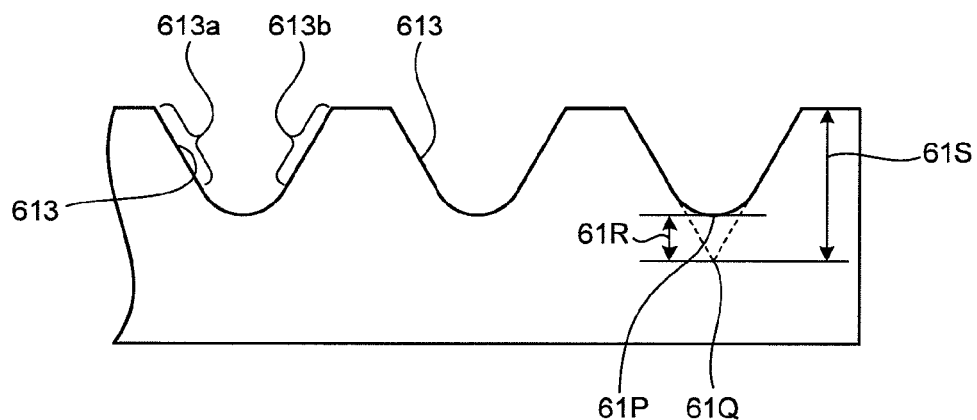
FIG. 12 is a partial cross-sectional view illustrating a modification of concave portions shown in FIG. 11.
Figure 13:
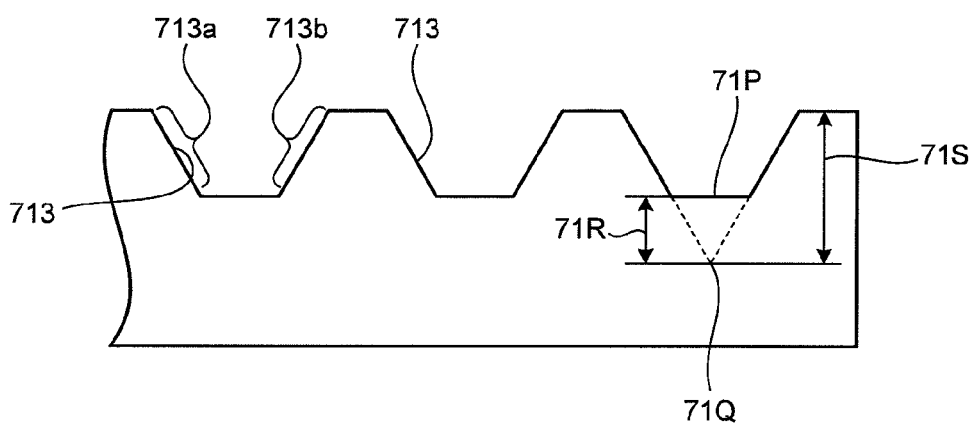
FIG. 13 is a partial cross-sectional view illustrating another modification of the concave portions shown in FIG. 11.

When the apex of each pyramid has a rounded shape as shown in FIG. 12, the difference 61R in height between the apex 61P and an apex 61Q, which is the non-rounded sharp apex of the pyramid, may be equal to or smaller than 20% of the height 61S of the pyramid with the non-rounded sharp apex. When the apex of each pyramid has a flat truncated shape as shown in FIG. 13, the difference 71R in height between a flat portion 71P and an apex 71Q, which is the non-flat sharp apex of the pyramid, may be equal to or smaller than 20% of the height 71S of the pyramid with the non-flat sharp apex.

No particular limitation is imposed on the depth of the concave portions in the concave-convex structure. The maximum value (Ra(max)) of the center line mean roughness measured in various directions (various directions in a plane parallel to the device light-emitting surface) on the surface having the concave-convex structure formed thereon may be in the range of 1 to 50 µm. When the concave-convex structure is formed on a substrate, the depth of the concave portions may be set to a preferred value relative to the thickness of the concave-convex structure layer. For example, when a hard material advantageous for maintaining the durability of the concave-convex structure layer is used as the material for the concave-convex structure layer, the smaller the thickness of the concave-convex structure layer, the higher the flexibility of the multi-layered body, and the more easily the multi-layered body can be handled in the process of manufacturing the surface light source device. More specifically, the difference between the depth 16D of the concave portion shown in FIG. 10 (the height from the apex 11P to the mean level of the flat portions 114 and 115) and the thickness 16E of the concave-convex structure layer 111 is preferably 0 to 30 μm.

In the present invention, the angle formed by the light-emitting surface and the oblique surfaces of the concave portions is preferably 40 to 70° and more preferably 45 to 60°. For example, when the shape of the concave portions is a quadrangular pyramid as shown in FIGS. 1, 2, 9, and 10, the vertex angle (the angle 11N in FIG. 10) is preferably 60 to 90°. From the viewpoint of minimizing the change in color tone at different viewing angles and improving the light extraction efficiency, the larger the angle between the oblique surfaces and the device light-emitting surface, the more preferable. More specifically, the angle is preferably, for example, 55° or larger and more preferably 60° or larger. In such a case, the upper limit of the angle may be about 70°, in consideration of maintaining the durability of the concave-convex structure layer.

When the shape of the concave portions is a pyramid or groove shape with a rounded or flat truncated apex, the angles of the oblique surfaces other than the rounded or truncated portions are regarded as the angles of the aforementioned oblique surfaces. For example, in the examples shown in FIGS. 12 and 13, surfaces 613a, 613b, 713a, and 713b are regarded as the oblique surfaces of the pyramids. By setting the angles of the oblique surfaces in this manner, the light extraction efficiency can be improved. The angles of all oblique surfaces of the concave-convex structure are not necessarily the same, and oblique surfaces having different angles within the aforementioned range may coexist.

The plurality of concave portions may be aligned on the device light-emitting surface in any form. For example, the plurality of concave portions may be aligned in two or more directions on the device light-emitting surface. More specifically, the plurality of concave portions may be aligned in two mutually orthogonal directions, as in the concave portions 113 shown in FIGS. 1 and 9.

When the concave portions are aligned in two or more directions, spacings may be provided between concave portions adjacent in one or more directions. By providing such spacings, flat portions are formed. For example, in the alignment of the concave portions 113 shown in FIG. 9, spacings 11J and 11K are provided in each of the two mutually orthogonal directions so as to form the flat portions 114 and 115. With this configuration, both favorable light extraction efficiency and high mechanical strength of the device light-emitting surface can be obtained.

(Manufacturing Method)

No particular limitation is imposed on the method of manufacturing the surface light source device of the present invention. Manufacture of the above exemplified surface light source device having the light-emitting surface structure layer including the concave-convex structure layer, the substrate film, the bonding layer and the glass substrate may be performed as follows. The layers constituting an organic EL element may be formed on one surface of the glass substrate. Before or after the formation of these layers, the multi-layered body including the concave-convex structure layer and the substrate film may be attached to the other surface of the glass substrate through a bonding layer. The surface light source device may thereby be manufactured.

The multi-layered body including the concave-convex structure layer and the substrate film may be manufactured by preparing a mold such as a metal mold having a desired shape and transferring this shape to the layer of a material for forming the concave-convex structure layer. Specific examples of the method may include:

(Method 1) a method that includes preparing an unprocessed multi-layered body having a layer of a resin composition A that forms the substrate film and a layer of a resin composition B for forming the concave-convex structure layer (the concave-convex structure has not been formed at this point) and forming the concave-convex structure on the surface on the resin composition B side of the unprocessed multi-layered body; and (Method 2) a method that includes applying the resin composition B in liquid form to the substrate film, putting a mold on the layer of the applied resin composition B, and curing the resin composition B with the mold put thereon to form the concave-convex structure layer.

In Method 1, the unprocessed multi-layered body may be obtained by, for example, extrusion molding in which the resin composition A and the resin composition B are co-extruded. Then a mold having a desired surface shape is pressed against the surface on the resin composition B side of the unprocessed multi-layered body, whereby the concave-convex structure is formed.

More specifically, an unprocessed multi-layered body in a lengthy shape is formed continuously by extrusion molding and is then pressed between a transcription roller having the desired surface shape and a nip roller. This allows continuous manufacturing in an efficient manner.

Preferably, the nipping pressure between the transcription roller and the nip roller is several MPa to several tens of MPa. Preferably, the temperature during transcription is equal to or higher than Tg and equal to or lower than (Tg+100° C.) where Tg is the glass transition temperature of the resin composition B. The contacting time of the unprocessed multi-layered body with the transcription roller may be controlled by adjusting the feeding speed of the film, i.e., the rotation speed of the rollers and is preferably 5 seconds or longer and 600 seconds or shorter.

In Method 2, it is preferable to use, as the resin composition B that forms the concave-convex structure layer, a composition that is curable with energy rays such as ultraviolet rays. Such a resin composition B is applied to the substrate film and cured by irradiation with energy rays such as ultraviolet rays from a light source positioned on the back side of the coated surface (the side opposite to the surface of the substrate film to which the resin composition B has been applied) with the mold put on the resin composition B. Then the mold is removed, whereby the multi-layered body in which the coating of the resin composition B serves as the concave-convex structure layer can be formed.

(Manufacturing Method: Formation of Mold)

Examples of the method of forming the mold used in the manufacturing of the multi-layered body in the present invention such as Methods 1 and 2 described above may include: a formation method in which a metal substrate is cut with a tool bit; and a method in which concave and convex portions are formed on a resin plate using, e.g., a laser and the resultant plate is used as an original mold to form the mold. The formation method in which a metal substrate is cut with a tool bit is a particularly preferred example because of its processing precision and ease of processing.

Figure 4:
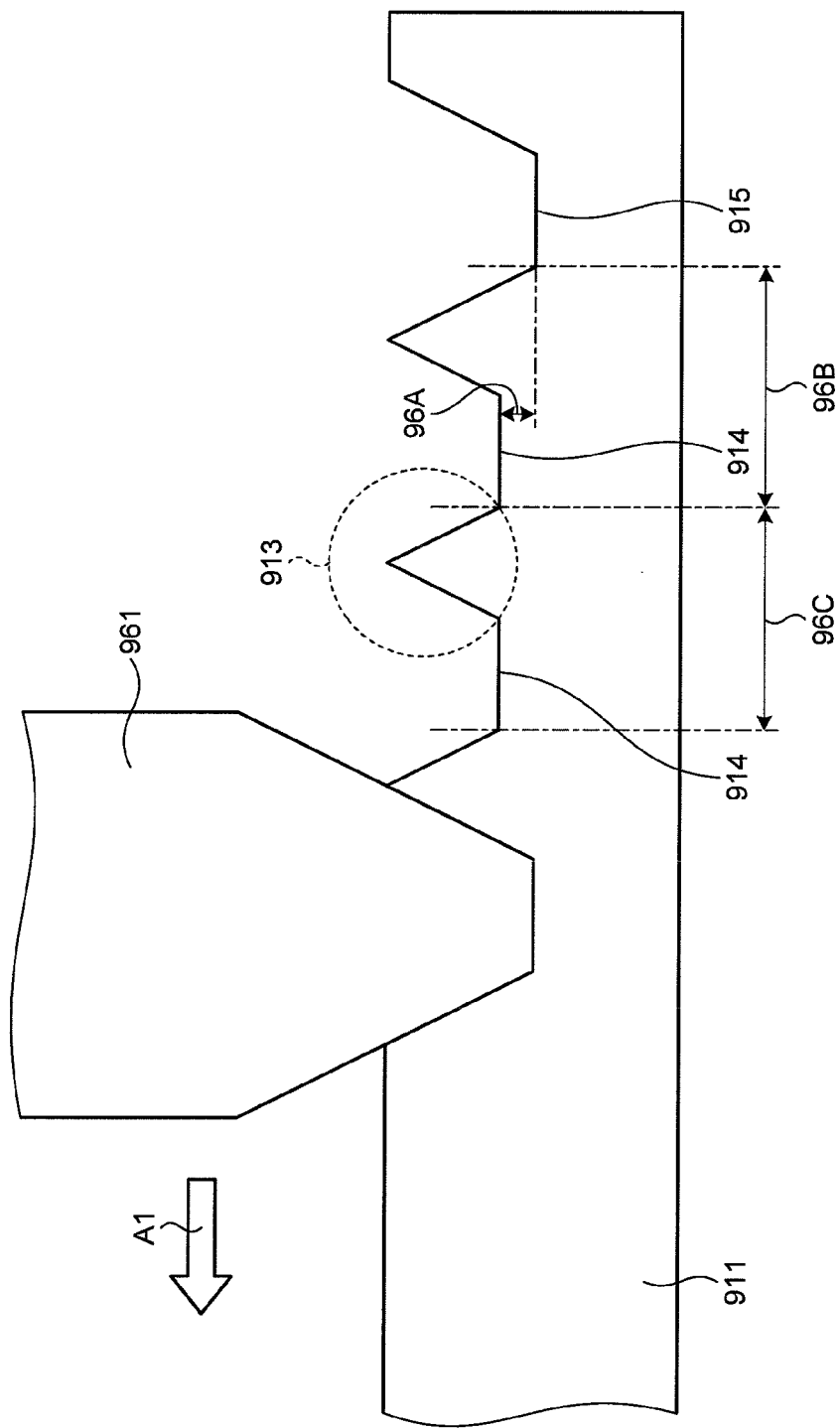
FIG. 4 is a cross-sectional view schematically showing an example of a method of forming a metal mold for producing a multi-layered body used in the present invention.

The formation method by cutting will be described with reference to FIG. 4. FIG. 4 is a cross-sectional view schematically showing an example of the method of forming a metal mold for manufacturing the multi-layered body used in the present invention. FIG. 4 illustrates a process of forming linear grooves aligned in parallel to each other using a tool bit 961 on a surface of a metal plate 911 that is being processed into a metal mold. The vertical cross-section in FIG. 4 is a cross-sectional view obtained by cutting the metal plate 911 along a plane perpendicular to the extending direction of the grooves.

Figure 5:
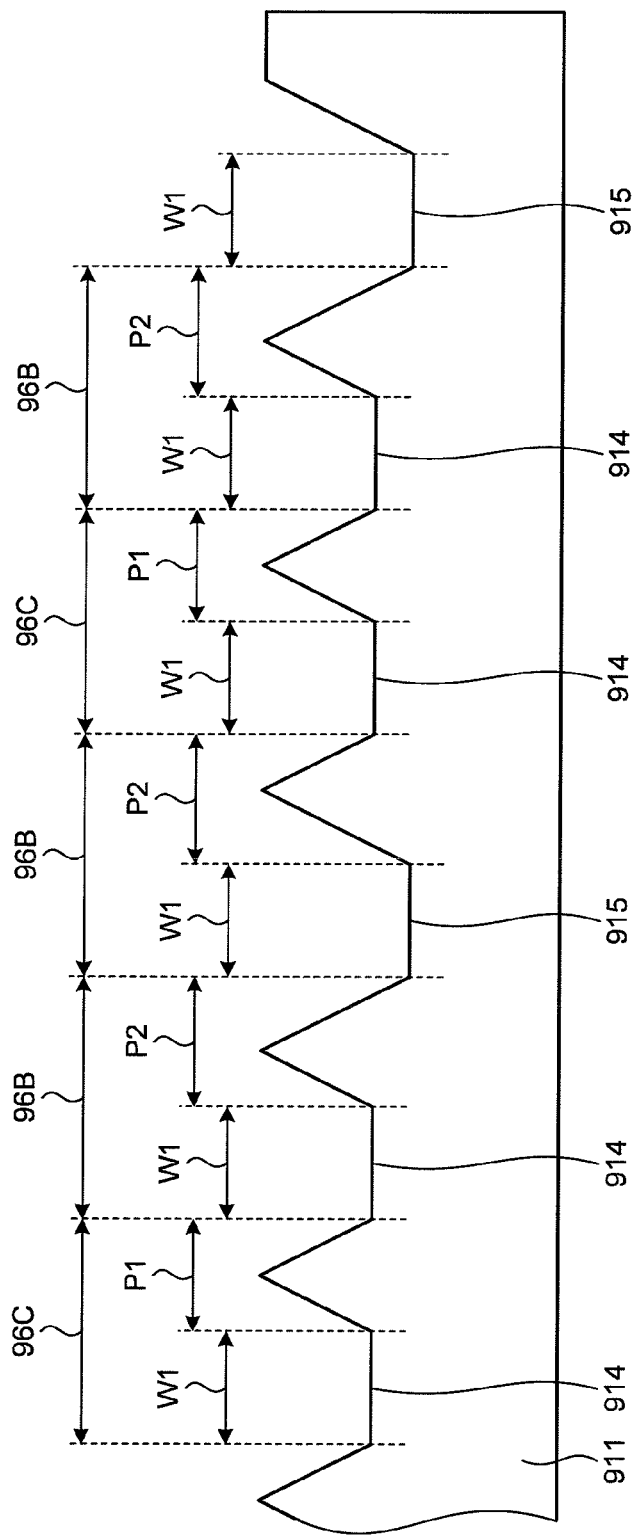
FIG. 5 is a cross-sectional view schematically showing an example of the metal mold formed by the forming method shown in FIG. 4.

In this formation method, the surface of the metal plate 911 is cut with the tool bit 961 to first form a groove 915 at the right end in FIG. 4. Then the cutting position of the tool bit 961 is moved upward by a distance 96A and moved in a direction of an arrow A1 by a distance 96B to form an adjacent groove 914. Then the cutting position of the tool bit 961 is moved in the direction of the arrow A1 by a distance 96C to form an adjacent groove 914. This operation is repeated, to thereby form grooves aligned in parallel to each other with a predetermined repeating pattern including grooves 914 and 915 as shown in FIG. 5 on the metal plate 911. The bottom surfaces of the grooves 914 and the bottom surface of the groove 915 are surfaces corresponding to the flat surfaces 114 and 115. Convex portions 913 on the cut surface are portions corresponding to the concave portion 113.

On the cut surface of the metal plate 911 shown in FIG. 5, the width W1 of the bottom surfaces of the grooves 914 and 915 corresponds to the shape of the cutting surface of the tool bit 961. The distances P1 and P2 between the bottom surfaces are distances that can be calculated by subtracting the width W1 from the moving distances 96B and 96C, respectively.

Next, a similar cutting operation is again performed on the surface of the metal plate 911 in a direction orthogonal to the extending direction of the grooves 914 and 915. In this manner, grooves corresponding to the flat portions 114 and 115 are formed in two mutually orthogonal directions in a plane, and quadrangular pyramid-shaped convex portions corresponding to the concave portions 113 are formed. A metal mold that can form the surface of the concave-convex structure layer 111 having the shape shown in FIGS. 1, 2, 9, and 10 can thereby be obtained.

Figure 6:
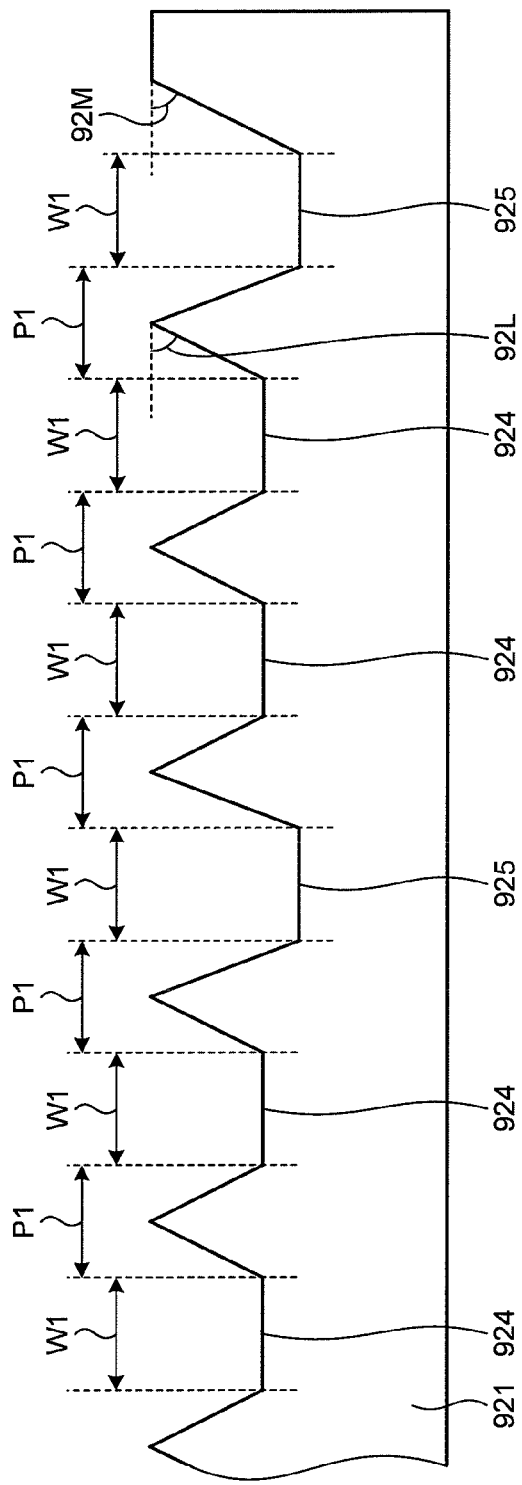
FIG. 6 is a cross-sectional view schematically showing an example of the metal mold formed by another forming method.

In the example described above, a common tool bit is used to form grooves having different depths. However, as will be described below, grooves having different depths may be formed using different tool bits suitable for the respective grooves. An example of the grooves formed using different tool bits is shown in FIG. 6. FIG. 6 shows a state of grooves 924 and 925 that are formed on a metal plate 921 using two types of tool bits having different shapes. The bottom surfaces of the grooves 924 and 925 have the same width W1. However, since the different tool bits are used, the inclination angles 92M and 92L of the oblique surfaces in the grooves are different. Since the oblique surfaces have different inclination angles, the distances P1 between the bottom surfaces of the grooves are constant. Formation of the grooves in this manner may result in a concave-convex structure in which only the heights of the flat portions or the depths of the concave portions in the finally obtained concave-convex structure layer are different (different in size) whereas the widths and spacings are uniform.

Figure 7:
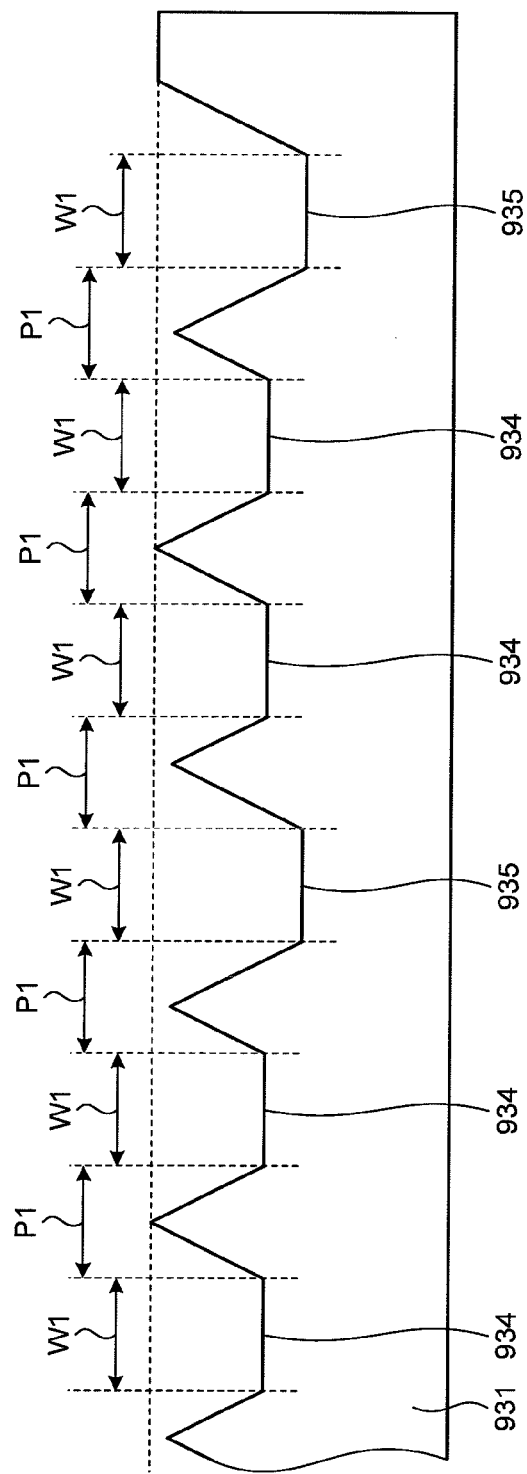
FIG. 7 is a cross-sectional view schematically showing an example of the metal mold formed by yet another forming method.

As another example, grooves having different depths as grooves 934 and 935 on a metal plate 931 shown in FIG. 7 may be formed using a common tool bit to form a shape in which only the heights of the flat portions or the depths of the concave portions are different (different in size). In this case, the depths of the apexes of the concave portions in the obtained concave-convex structure layer become non-uniform. However, if there is no problem for use, a concave-convex structure layer having such a form can be easily formed and used.

Second Embodiment

In the surface light source device of the present invention, the shape of the concave portions forming the device light-emitting surface is not limited to the pyramid shape exemplified in the first embodiment. For example, the shape may be a groove shape as in a second embodiment described below.

Figure 3:
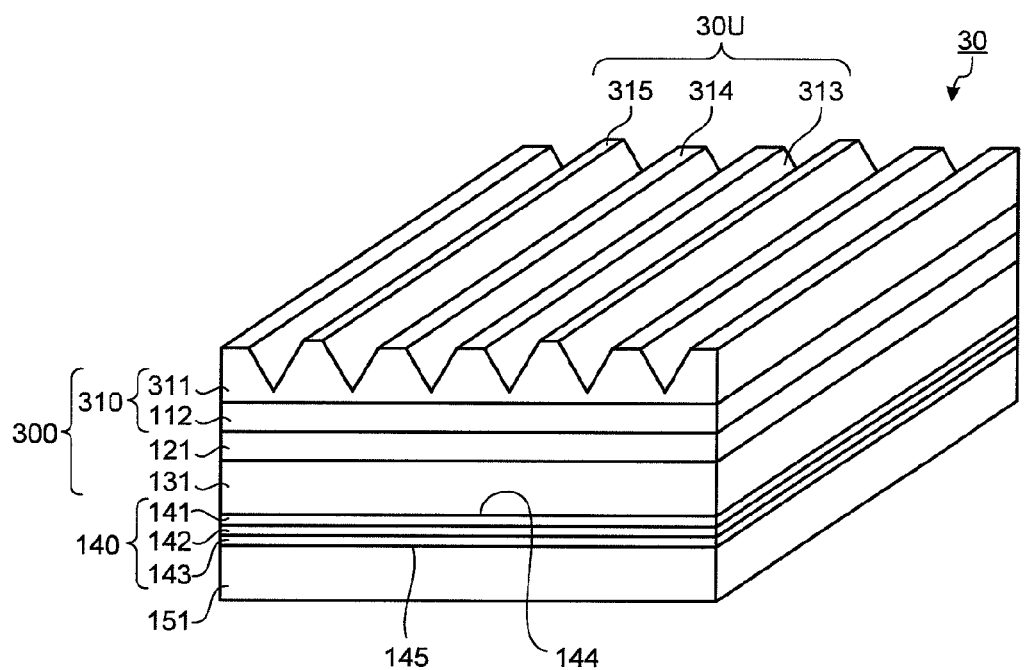
FIG. 3 is a perspective view schematically showing a surface light source device according to a second embodiment of the present invention.

FIG. 3 is a perspective view schematically showing a surface light source device according to the second embodiment of the present invention. As shown in FIG. 3, the surface light source device 30 according to the second embodiment has the same configuration as that of the first embodiment except that the shape of the device light-emitting surface, i.e. the surface shape of a concave-convex structure layer 311 in a multi-layered body 310 constituting a light-emitting surface structure layer 300, is different from that in the first embodiment.

Each of a plurality of concave portions 313 formed on the surface of the concave-convex structure layer 311 has a linear groove shape and includes two flat oblique surfaces. Therefore, a cross-section obtained by cutting a concave portion 313 along a plane perpendicular to the extending direction of the grooves has a triangular shape with two oblique sides. The plurality of concave portions 313 are aligned in parallel to each other on a device light-emitting surface 30U. At each gap between adjacent concave portions 313, any of spacings 314 and 315 having different heights is provided, and the spacings 314 and 315 form flat portions on the device light-emitting surface 30U.

With the device light-emitting surface having a structure including the groove-shaped concave portions and the flat portions formed as the spacings therebetween, the light extraction efficiency can also be improved, and a change in color tone at different viewing angles can also be reduced, as in the pyramid-shaped concave portions in the first embodiment. In addition, the mechanical strength of the device light-emitting surface can be improved.

No particular limitation is imposed on the groove shape of the concave portions so long as it includes oblique surfaces. The cross-sectional shape of the concave portions is not limited to a triangular shape exemplified above and may be any of various shapes. For example, the cross-sectional shape of the grooves may be any of other polygonal shapes such as pentagonal and heptagonal shapes and shapes other than polygonal shapes such as a part of a circle. Similar to the aforementioned first embodiment wherein the apexes of the pyramids or cones may be deformed to be a rounded shape or a flat truncated shape, the shape of the cross-section of each groove may be deformed to be a shape with a rounded apex or a flat truncated shape.

Third Embodiment

In the first and second embodiments described above, the flat portions of the device light-emitting surface are of two groups, i.e., low-height flat portions (114 or 314) and high-height flat portions (115 or 315), and therefore there are only two variations in heights of the flat portions. However, the present invention is not limited thereto. For example, as in a third embodiment which will be described below, the differences in height (size differences) between the flat portions may be three or more differences, and three or more groups of flat portions having different heights may be provided.

Figure 8:
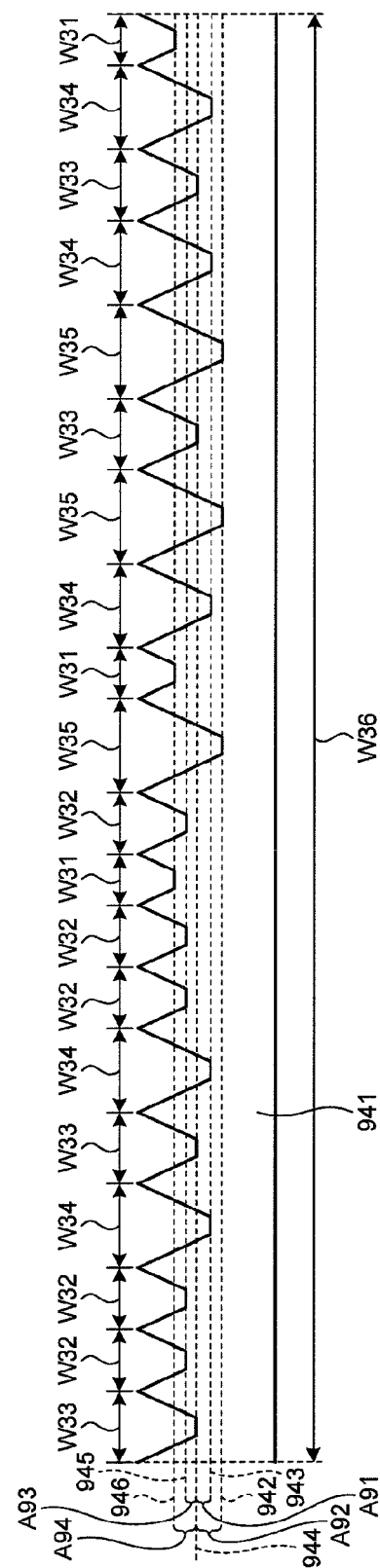
FIG. 8 is a cross-sectional view schematically showing an example of the metal mold formed by still another forming method.

FIG. 8 is a partial cross-sectional view schematically showing the manner of forming grooves for forming a metal mold used to form the concave-convex structure on the device light-emitting surface of a surface light source device according to the third embodiment of the present invention. In FIG. 8, a metal mold 941 has five types of grooves formed using tool bits having the same shape. Each of the grooves has one of five different widths W31 to W35. The bottom portion of a groove having the width W31 is located at a level 946 that is shallower by a height A94 than a line 944 indicating the mean depth of the grooves. The bottom portion of a groove having the width W32 is located at a level 945 that is shallower by a height A93 than the line 944 indicating the mean depth of the grooves. The bottom portion of a groove having the width W33 is located at the level of the line 944 indicating the mean depth of the grooves. The bottom portion of a groove having the width W34 is located at a level 943 that is deeper by a height A91 than the line 944 indicating the mean depth of the grooves. The bottom portion of a groove having the width W35 is located at a level 942 that is deeper by a height A92 than the line 944 indicating the mean depth of the grooves. In the present embodiment, the heights A91 and A93 are the same, and the heights A92 and A94 are the same. The heights A91 and A93 are one half of the heights A92 and A94. That is, the five groups of grooves have five different (different in size) depths at regular intervals.

A set of the randomly aligned five types of grooves forms a unit W36, and a shape in which this unit is repeated is provided on the surface of the metal mold 941. Such grooves having the aforementioned shapes are formed in one direction in a plane of the metal mold and then formed in a direction orthogonal to the one direction. In this manner, a metal mold being able to form a concave-convex structure including concave portions with a quadrangular pyramid shape and five groups of flat portions having five different heights and disposed around the concave portions can be formed.

When three or more groups of flat portions with three or more height differences (size differences) are provided as described above, it is preferable that each of the height differences (size differences) between the groups be a difference (size difference) larger than the difference that causes interference of one or both of emitted light and reflected light. For example, in the example in FIG. 8, it is preferable that each of the ratio between the heights of the levels 942 and 943, the ratio between the heights of the levels 943 and 944, the ratio between the heights of the levels 944 and 945, and the ratio between the heights of the levels 945 and 946 be the ratio indicating a difference (size difference) larger than the difference that causes interference of one or both of emitted light and reflected light. When three of more groups of flat portions with size differences larger than the difference that causes interference of one or both of emitted light and reflected light are used as described above, the rainbow unevenness can be reduced in a more effective manner.

Also when three or more groups of concave portions with size differences larger than the difference that causes interference of one or both of emitted light and reflected light are adopted, the rainbow unevenness can be similarly reduced in a more effective manner.

Fourth Embodiment

In the first to third embodiments described above, the device light-emitting surface is provided only on one side of the surface light source device, but the present invention is not limited thereto. For example, the device light-emitting surface may be provided on both sides of a surface light source device, as in a fourth embodiment described below.

Figure 16:
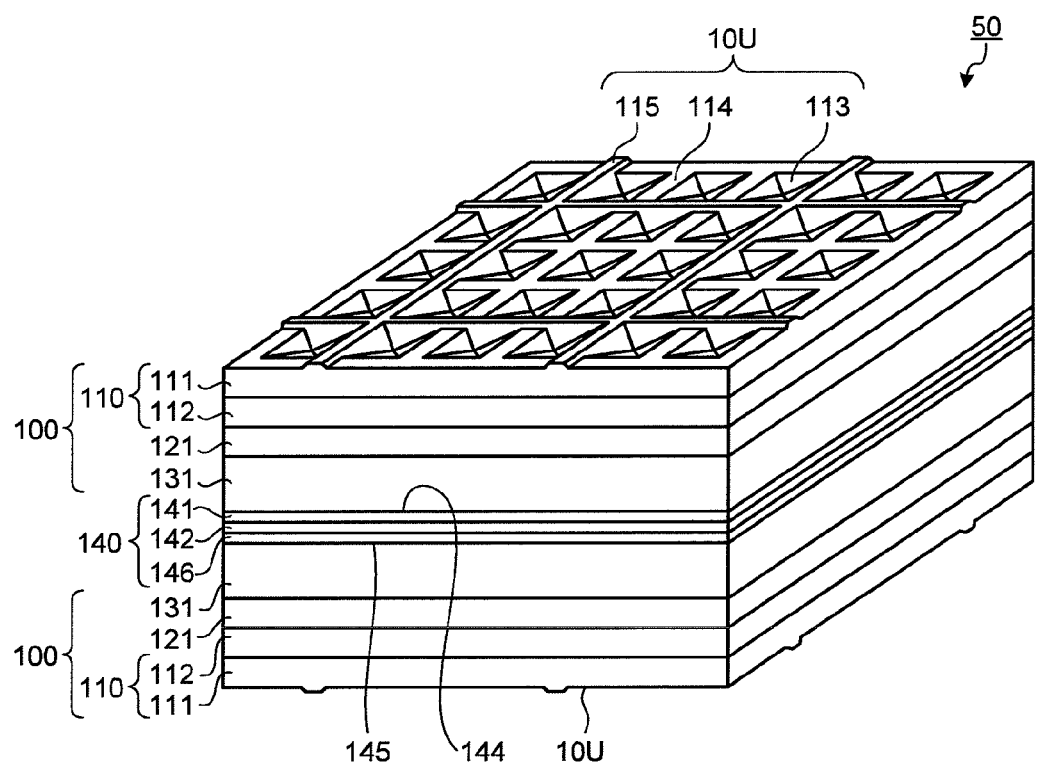
FIG. 16 is a perspective view schematically showing a surface light source device according to a fourth embodiment of the present invention.

FIG. 16 is a perspective view schematically showing a surface light source device according to the fourth embodiment of the present invention. The surface light source device 50 in the fourth embodiment has the same configuration as that in the first embodiment except that a second electrode layer 146 as a transparent electrode is provided instead of the second electrode layer 143 as a reflecting electrode and that another light-emitting surface structure layer 100 is provided instead of the sealing substrate 151. Therefore, in the surface light source device 50 in the present embodiment, the light-emitting surface structure layers 100 are disposed so as to be in contact with the both surfaces 144 and 145 of the organic EL element 140.

Since the second electrode layer 146 is a transparent electrode, the light from the luminescent layer 142 passes through the first electrode layer 141 and the second electrode layer 146 and is then emitted from the device light-emitting surfaces 10U on the upper and lower sides in the figure. When light is emitted from both the front and back sides, the advantages similar to those in the first embodiment can also be obtained.

In the surface light source device 50 in the present embodiment, generally, the light that enters one of the device light-emitting surfaces 10U passes through the surface light source device 50 and is emitted from the other device light-emitting surface 10U. Therefore, the opposite side can be viewed with naked eyes through the surface light source device 50, and the surface light source device can be of a see-through type. This allows diversification of the design.

In the present embodiment, the light-emitting surface structure layer adopted is the same as that adopted in the first embodiment, but the configuration of the light-emitting surface structure layer is not limited thereto. For example, the light-emitting surface structure layer described in the second or third embodiment may be adopted.

In the example shown in the present embodiment, the light-emitting surface structure layers 100 having the same configuration are disposed on both the upper surface 144 and the lower surface 145 in the figure of the organic EL element 140. However, a combination of different light-emitting surface structure layers may be provided. For example, a light-emitting surface structure layer 100 similar to that in the first embodiment may be provided on the surface 144 of the first electrode layer 141, and a light-emitting surface structure layer 300 similar to that in the second embodiment may be provided on the surface 145 of the second electrode layer 146.

In the case in which a transparent electrode is adopted as the second electrode layer 146 to allow light to be emitted from both the surfaces 144 and 145 of the organic EL element, if a light-emitting surface structure layer is provided on at least one of these surfaces, the other surface does not have to be equipped with the light-emitting surface structure layer.

<Lighting Device and Backlight Device>

Each of a lighting device of the present invention and a backlight device of the present invention includes the surface light source device of the present invention.

The lighting device of the present invention includes the surface light source device of the present invention as a light source and may further include an optional component such as a member for holding the light source and a circuit for supplying electric power. The backlight device of the present invention includes the surface light source device of the present invention as a light source and may further include an optional component such as a casing, a circuit for supplying power, a diffusion plate for further improving uniformity of the emitted light, a diffusion sheet, and a prism sheet. The applications of the backlight device of the present invention include display devices, such as liquid crystal display devices, for displaying images by controlling pixels and backlights for display devices, such as signboards, for displaying still images.

The present invention is not limited to the examples shown in the aforementioned embodiments, and modifications may be made within the scope of the claims of the present application and the scope of equivalents thereto.

For example, in the description of the aforementioned embodiments, the light-emitting surface structure layers that are composed of a concave-convex structure layer, a substrate film layer, a bonding layer, and a glass substrate have been exemplified. However, the light-emitting surface structure layer may be composed of a smaller number of layers, or alternatively may further include, in addition to these layers, an optional layer. For example, a coating layer may be provided on the concave-convex structure layer and the coating layer may define the concave-convex structure of the device light-emitting surface.

In the examples shown in the aforementioned embodiments, all the concave portions distributed over the entire device light-emitting surface have the same shape. However, concave portions having different shapes may also be present on the device light-emitting surface. For example, pyramid-shaped concave portions having different sizes may be present, or a concave portion having a shape of a combination of a plurality of pyramids and a concave portion having a simple pyramid shape may coexist.

In the examples shown in the aforementioned embodiments, the heights of the flat portions or the depths of the concave portions are different (different in size), and the widths of the flat portions, the spacings between adjacent flat portions, the widths of the concave portions and the spacings between adjacent concave portions are optionally different (different in size) or are not different. However, the concave-convex structure may be a structure which does not have difference (difference in size) in the heights of the flat portions or the depths of the concave portions, but has difference (difference in size) regarding one or more of the widths of the flat portions, the spacings between the flat portions, the widths of the concave portions and the spacings between the concave portions. With such a structure, the rainbow unevenness due to interference can be suppressed as in the case in which the heights of the flat portions or the depths of the concave portions are different (different in size).

For the purpose of further improving the light extraction efficiency and the viewing angle characteristics, the surface light source device of the present invention may further include a diffusing member which allows the light to pass therethrough or reflects the light in an diffused manner. The diffusing member may be provided as a layer that forms part of or all the light-emitting surface structure layer or as a member disposed farther from the light-emitting surface structure layer than the organic EL element, or diffusing members may be provided as the aforementioned layer and member. That is, in the present invention, part of or all the light-emitting surface structure layer may have the function of a diffusing member, or a diffusing member may be provided as a member other than the light-emitting surface structure layer.

In the examples of the surface light source devices including the reflecting electrode layer shown in the aforementioned embodiments, the reflecting electrode layer may be replaced with a transparent electrode. In such a case, the rainbow unevenness due to interference can also be suppressed. In addition, when the reflecting electrode is replaced with a combination of a transparent electrode and a reflecting layer, a device having the same effect as that with the reflecting electrode can also be configured.

Examples

The present invention will be described in more detail by way of Examples and a Comparative Example. However, the present invention is not limited to the Examples described below. In the following description, the refractive indexes of resins used are the refractive indexes after curing. In the present invention, the outer shape and size of a concave-convex structure were observed and measured using an ultra-deep color 3D profile measuring microscope (VK-9500, product of KEYENCE Corporation).

Example 1

The surface light source device schematically shown in FIGS. 1 and 2 was produced and evaluated. The device schematically shown in FIG. 1 includes the organic EL element 140 composed only of three layers. However, the surface light source device produced in the present Example includes an organic EL element having a larger number of luminescent layers.

1-1: Formation of Organic EL Element

A transparent electrode layer with a thickness of 100 nm, a hole transport layer with a thickness of 10 nm, a yellow luminescent layer with a thickness of 20 nm, a blue luminescent layer with a thickness of 15 nm, an electron transport layer with a thickness of 15 nm, an electron injection layer with a thickness of 1 nm, and a reflecting electrode layer with a thickness of 100 nm were formed in this order on one principal surface of a glass substrate with a thickness of 0.7 mm. All the layers from the hole transport layer to the electron transport layer were formed of organic materials. The yellow luminescent layer and the blue luminescent layer have different light-emission spectra.

The materials for forming the respective layers from the transparent electrode layer to the reflecting electrode layer were as follows.

Transparent electrode layer: tin-doped indium oxide (ITO)
Hole transport layer: 4,4'-bis[N-(naphthyl)-N-phenylamino]biphenyl ($\alpha$-NPD)
Yellow luminescent layer: $\alpha$-NPD containing 1.5 wt % of rubrene
Blue luminescent layer: 4,4'-dicarbazolyl-1,1'-biphenyl (CBP) containing 10 wt % of iridium complex
Electron transport layer: phenanthroline derivative (BCP)
Electron injection layer: lithium fluoride (LiF)
Reflecting electrode layer: Al The transparent electrode layer was formed by reactive sputtering with an ITO target, and the surface resistance was 10Ω/ or smaller. To form the layers from the hole injection layer to the reflecting electrode layer, the glass substrate having the transparent electrode layer formed thereon was placed in a vacuum deposition apparatus, and the materials for the layers from the hole injection layer to the reflecting electrode layer were successively vapor-deposited by resistance heating. The inner pressure of the system was $5\times10^{-3}$ Pa, and the evaporation rates were 0.1 to 0.2 nm/s.

Wiring leads for supplying a current were attached to the electrode layers. The layers from the hole transport layer to the reflecting electrode layer were sealed with a sealing member, to thereby produce an organic EL element. The obtained organic EL element had a rectangular light-emitting surface that was capable of emitting white light from the glass substrate side.

1-2: Preparation of Multi-Layered Body 110

A UV (ultraviolet) curable resin (urethane acrylate resin, refractive index: n=1.54) was applied to a substrate film (ZEONOR Film, product of ZEON Corporation). Then a metal mold having a predetermined shape was pressed against the coating of the resin composition, and the resin composition was irradiated with ultraviolet rays at an accumulated light quantity of 1000 mJ/cm$^2$ from the substrate film side to form a concave-convex structure layer on the substrate film. A multi-layered body 110 in the form of a rectangular film having a layer structure of (the substrate film 112)—(the concave-convex structure layer 111) was thereby obtained.

In the multi-layered body 110, the concave-convex structure on the concave-convex structure layer 111 was composed of a plurality of concave portions 113 having a regular quadrangular pyramid shape and flat portions 114 and 115 disposed around the concave portions, as shown in FIGS. 9 and 10. The angles (such as 11L and 11M) between the flat portions and the oblique surfaces constituting the concave portions 113 were 60°. The length of the base edges (11E to 11H) of the concave portions 113 was 16 μm. The width 11J of the flat portions 114 between the concave portions 113 was 4 μm, and the width 11X of the flat portions 115 was 4 μm. These widths were constant. The difference (size difference) in height between the flat portions 114 and the flat portions 115 was 2 μm. The base edges of the concave portions 113 were parallel to the long edge or short edge direction of the multi-layered body 110. The thickness of the concave-convex structure layer 111 (the thickness from the mean height of the flat portions 114 and 115 to a plane in contact with the substrate film) was 34 μm, and the thickness of the substrate film layer 112 was 100 μm. The flat portion ratio was 36%.

1-3: Surface Light Source Device (with Multi-Layered Body)

The multi-layered body 110 obtained in (1-2) was attached to the surface on the glass substrate 131 side of the organic EL element with the glass substrate obtained in (1-1) through an adhesive agent (CS9621, acrylic-based resin, refractive index: 1.49, product of NITTO DENKO Corporation). A surface light source device having a layer structure of (multi-layered body 110)-(the bonding layer 121)-(the glass substrate 131)-(the organic EL element 140) was thereby obtained. The thickness of the bonding layer was 20 μm.

1-4: Evaluation

A reflection image on the surface of the surface light source device obtained in (1-3) with power turned off was observed. Almost no rainbow unevenness was observed.

Comparative Example 1

Figure 14:
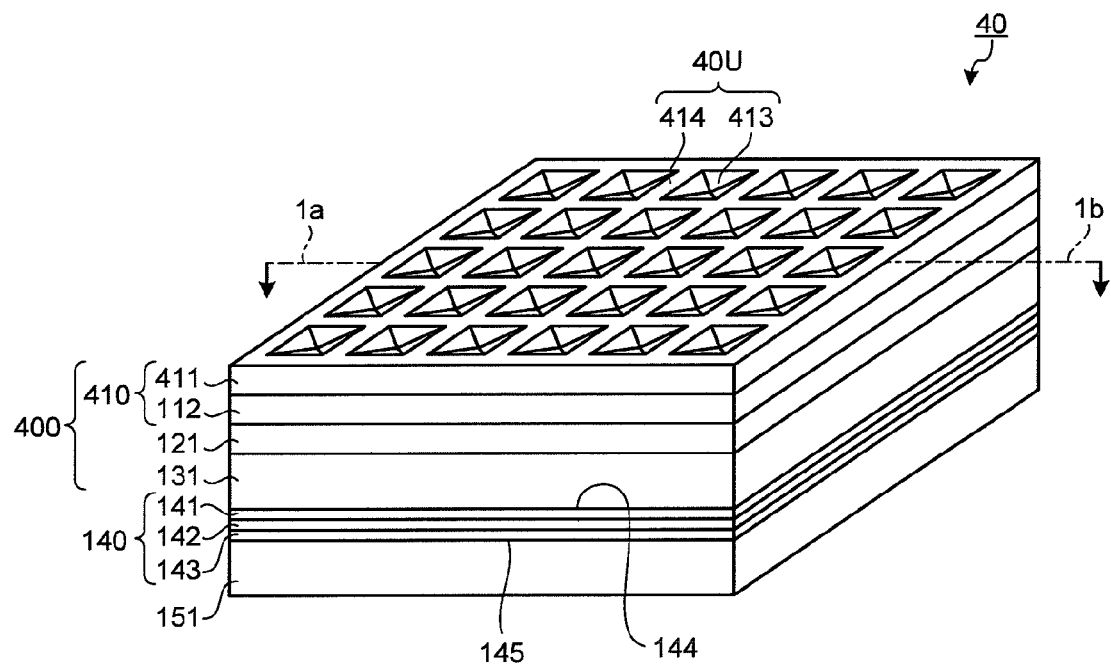
FIG. 14 is a perspective view schematically showing a surface light source device produced in Comparative Example 1.

A multi-layered body and a surface light source device were prepared by the same procedure as in Example 1 except that the shape of the metal mold used in the preparation of the multi-layered body in (1-2) was changed. In the obtained multi-layered body, the shape of the concave portions was the same as that in Example 1. However, the flat portions included only flat portions 414 having a uniform height as shown in FIG. 14.

Figure 15:
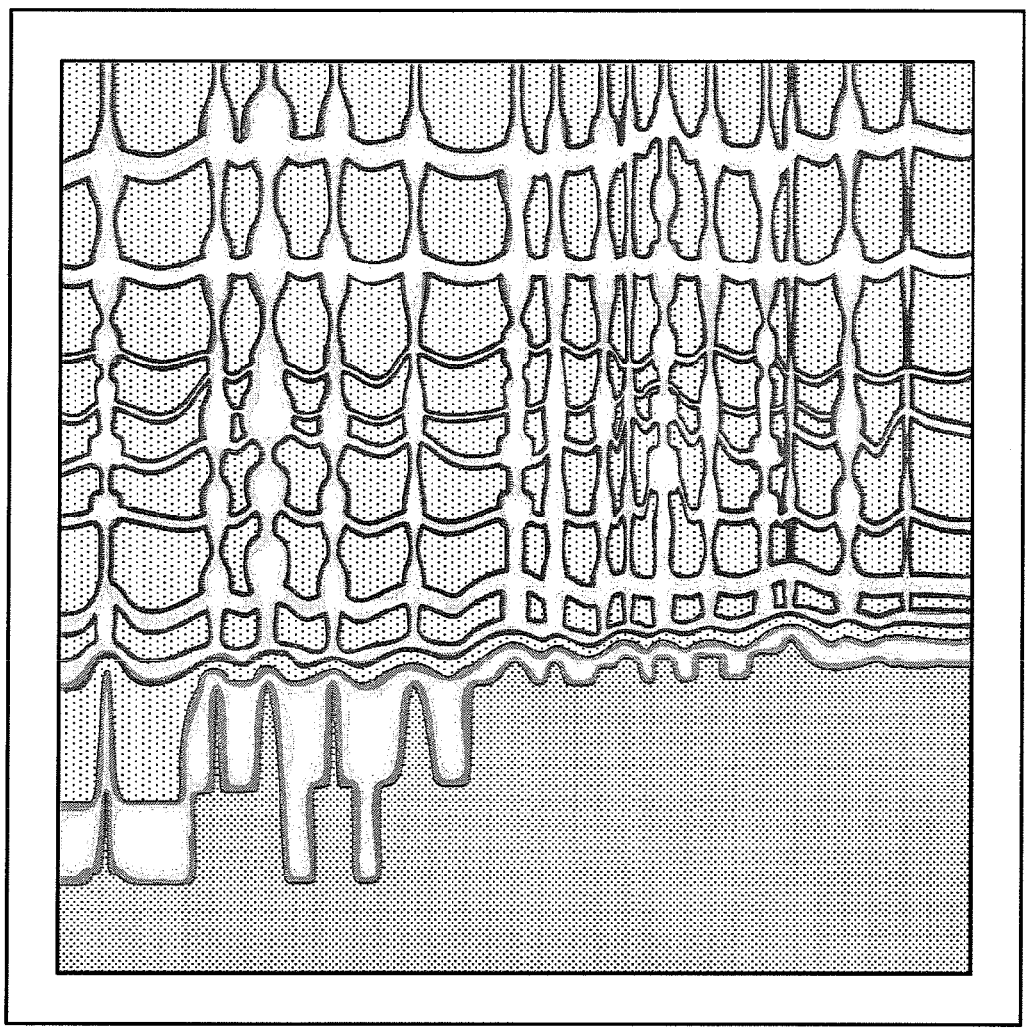
FIG. 15 is a top view schematically showing the rainbow unevenness observed on the device light-emitting surface of a surface light source device in a conventional technology.

The obtained surface light source device was observed under the same conditions as those in (1-4) in Example 1. The rainbow unevenness shown in FIG. 15 was observed.

Example 2

A multi-layered body 110 and a surface light source device were prepared by the same procedure as in Example 1 except that the shape of the metal mold used in the preparation of the multi-layered body 110 in (1-2) was changed.

In the present Example, the concave-convex shape of the device light-emitting surface included five groups of flat surfaces with different heights. More specifically, when the mold was formed, the surface of a metal plate for preparing the mold was processed to form repeating units W36 as shown in FIG. 8 in one direction of the plane, and then repeating units W36 were formed in a direction orthogonal to the aforementioned direction. The widths W31 to W35 of the grooves shown in FIG. 8 were 17.69 μm, 18.85 μm, 20 μm, 21.15 μm, and 22.31 μm, respectively. The heights of the grooves were 11.86 μm, 12.86 μm, 13.86 μm, 14.86 μm, and 15.86 μm, respectively.

The obtained surface light source device was observed under the same conditions as those in (1-4) in Example 1. It was found out that the surface light source device was in a favorable state in which the rainbow unevenness was further reduced than in Example 1.

Example 3

A multi-layered body 110 and a surface light source device were prepared by the same procedure as in Example 1 except that the metal mold used in the preparation of the multi-layered body 110 in (1-2) was changed. In Example 3, nickel electroforming on the metal mold used in Example 1 was performed to prepare a metal mold having a surface shape that is a reversed shape of the concave-convex structure, and the metal mold thus prepared was used.

The obtained surface light source device was observed under the same conditions as those in (1-4) in Example 1. It was found out that the surface light source device was in a favorable state in which the rainbow unevenness was further reduced than in Example 1.

Example 4

1-5: Formation of Transparent Organic EL Element

A hole injection layer, a hole transport layer, a luminescent layer, a hole blocking layer, a charge generation layer, a metal oxide layer, and a cathode layer were formed in that order on a glass substrate having a transparent electrode layer formed on its principal surface. The materials used to form these layers and their thicknesses are as follows.

Transparent electrode layer: ITO 300 nm
Hole injection layer: molybdenum trioxide ($MoO_3$) 5 nm
Hole transport layer: NS21 (product of Nippon Steel Chemical Co., Ltd.) and $MoO_3$ 20 nm, and NS212 5 nm, total 25 nm
luminescent layer: NS21 and EY52 (products of e-Ray Optoelectronics Technology (hereinafter referred to as e-Ray) 20 nm, and EB43 and EB52 (products of e-Ray) 30 nm, total 50 nm
Hole blocking layer: bis(2-methyl-8-quinolinolato)(p-phenylphenolato) aluminum (BAlq) 5 nm
Charge generation layer: Liq and DPB 35 nm, aluminum 1.5 nm, and NS21 and $MoO_3$ 10 nm, total 37.5 nm
Metal oxide layer: $MoO_3$ 5 nm
Cathode layer: ITO 100 nm To form the layers from the hole injection layer to the metal oxide layer, the glass substrate having the transparent electrode layer formed thereon was placed in a vacuum deposition apparatus, and the materials for the layers from the hole injection layer to the metal oxide layer were successively vapor-deposited by resistance heating. The inner pressure of the system was 5×10³ Pa, and the evaporation rates were 0.1 to 0.2 nm/s. The ITO for the cathode layer was formed by facing target sputtering. These layers were sealed by another glass plate using a UV curable resin, to thereby produce a transparent organic EL element 1. The obtained transparent organic EL element 1 emitted white light from both sides.

A multi-layered body 110 was prepared by the same procedure as in Example 2 except that the shape of the metal mold used in the preparation of the multi-layered body 110 in (1-2) was changed. Next, the obtained multi-layered body 110 was attached to the transparent organic EL element 1 obtained in (1-5), to thereby obtain a surface light source device.

In the present Example, the size of the concave-convex structure layer of the surface light source device were set as follows. The width 11X of the flat portions 114 and the width 11J of the flat portions 115 shown in FIGS. 9 and 10 were set to 8 μm. The size of the metal mold used were set as follows. The widths W31 to W35 of the grooves in the repeating unit W36 shown in FIG. 8 were set to 17.69 μm, 18.85 μm, 20 μm, 21.15 μm, and 22.31 μm, respectively, and the heights of these grooves were set to 8.39 μm, 9.39 μm, 10.39 μm, 11.39 μm, and 12.39 μm, respectively. The obtained surface light source device was observed under the same conditions as those in (1-4) in Example 1. It was found out that the surface light source device was in a favorable state in which the rainbow unevenness was reduced as in Example 1.

Example 5

1-6: Production of Organic EL Element with Reflecting Member

Manufacturing Example 1

Production of Reflecting Member

An ultraviolet curable resin (an acrylate-based resin, refractive index: n=1.53) was applied to one surface of a substrate film formed of a resin having an alicyclic structure (product name: "ZEONOR Film," product of ZEON Corporation) to form a coating. Then a metal mold having a predetermined shape was pressed against the coating, and the coating was irradiated with ultraviolet rays at an accumulated light quantity of 1,000 mJ/cm² from the substrate film side to cure the coating. A concave-convex structure portion was thereby formed on the substrate film. Next, the metal mold was removed from the concave-convex structure portion to thereby obtain a reflecting member composite substrate including the substrate film and the concave-convex structure portion.

Figure 17:
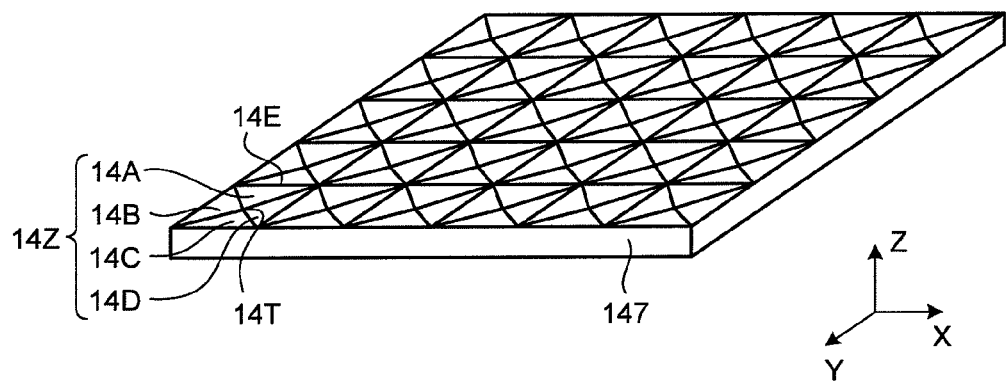
FIG. 17 is a perspective view schematically showing a reflecting member composite substrate produced in Example 5.

FIG. 17 is a perspective view schematically showing the reflecting member composite substrate produced in Example 5. The concave-convex structure on the surface of the concave-convex structure portion of the obtained reflecting member composite substrate 147 was composed of a plurality of concave portions 14Z having a regular quadrangular pyramid shape, as schematically shown in FIG. 17. The angles formed by the surface of the substrate film and the oblique surfaces 14A to 14D constituting each concave portion 14Z was 30°. The length of the base edges 14E of the concave portions 14Z was 20 μm. In this structure, the concave portions 14Z were aligned at a pitch of 20 μm in two orthogonal directions X and Y on the surface of the concave-convex structure portion. The thickness of the reflecting member composite substrate 147 as a whole was 200 μm.

1-7: Reflecting Layer Having Concave-Convex Structure

On the surface of the reflecting member composite substrate obtained in (1-6) on which the concave-convex structure was formed, silver was vapor-deposited to a thickness of 200 nm, to thereby form a metal reflecting layer. A reflecting member composite body including the reflecting member composite substrate and the reflecting layer having the concave-convex structure was thereby obtained.

The reflecting member composite body obtained in (1-7) was attached onto the sealing glass plate side of the transparent organic EL element 1 obtained in (1-5) through an adhesive agent (CS9621, acrylic-based resin, refractive index: 1.49, product of NITTO DENKO Corporation). An organic EL element with the reflecting member was thereby obtained.

Onto the light-emitting surface side of the obtained organic EL element with the reflecting member, the multi-layered body produced in Example 2 was attached through an adhesive agent (CS9621, acrylic-based resin, refractive index: 1.49, product of NITTO DENKO Corporation), to thereby obtain a surface light source device.

The obtained surface light source device was observed under the same conditions as those in (1-4) in Example 1. It was found out that the surface light source device was in a favorable state in which the rainbow unevenness was reduced as in Example 1.

EXPLANATION OF NUMERALS

10 surface light source device
10U device light-emitting surface
100 light-emitting surface structure layer
110 multi-layered body
111 concave-convex structure layer
112 substrate film
113 concave portion
114 flat portion
115 flat portion
11A to 11D oblique surface
11E to 11H base edge
11W oblique surface
11P apex
14A to 14D oblique surface
14E base edge
14T apex
14Z concave-convex structure unit
121 bonding layer
131 glass substrate
140 organic EL element
141 electrode layer
142 luminescent layer
143 electrode layer
144 surface of organic EL element
145 surface of organic EL element
146 electrode layer
147 reflecting member composite substrate
151 sealing substrate
30 surface light source device
300 light-emitting surface structure layer
310 multi-layered body
311 concave-convex structure layer
313 concave portion
314 flat portion
315 flat portion
40 surface light source device
40U device light-emitting surface 400 light-emitting surface structure layer
410 multi-layered body
411 concave-convex structure layer
413 concave portion
414 flat portion
50 surface light source device
911 metal plate
913 convex portion
914 groove
915 groove
921 metal plate
924 groove
925 groove
931 metal plate
934 groove
935 groove
941 metal plate
961 tool bit

The invention claimed is:

1. A surface light source device comprising:
an organic electroluminescent element including a luminescent layer; and
a light-emitting surface structure layer disposed on at least one of surfaces of the organic electroluminescent element, wherein:
the light-emitting surface structure layer includes a concave-convex structure provided on a surface thereof on a side toward a light-emitting surface of the device,
the concave-convex structure includes a plurality of concave portions having oblique surfaces and flat portions disposed around the concave portions, and
wherein at least one flat portion or concave portion has a size difference from at least one other flat portion or concave portion respectively, where said size difference is in one or more of a height thereof, and a depth thereof, the size difference being 0.62 times or larger than the center wavelength of one or both of emitted light and reflected light.

2. The surface light source device according to claim 1, wherein in a cross-section obtained by cutting the light-emitting surface structure layer along a plane that is perpendicular to the device light-emitting surface and passes through the concave portions, the device light-emitting surface includes a repeating unit composed of two or more concave portions and two or more flat portions.

3. The surface light source device according to claim 1, wherein, when the concave-convex structure is observed in a direction perpendicular to the device light-emitting surface, a ratio of an area occupied by the flat portions to the sum of the area occupied by the flat portions and an area occupied by the concave portions is 10 to 75%.

4. A lighting device comprising a surface light source device according to claim 1.

5. A backlight device comprising a surface light source device according to claim 1.

6. The surface light source device according to claim 1, wherein
the organic electroluminescent element includes two or more electrode layers and the luminescent layer that is disposed between the electrode layers and emits light when a voltage is applied from the electrode layers, and
each of the two or more electrode layers is a layer consisting of a transparent electrode.

7. A surface light source device comprising:
an organic electroluminescent element including a luminescent layer; and
a light-emitting surface structure layer disposed on at least one of surfaces of the organic electroluminescent element, wherein:
the light-emitting surface structure layer includes a concave-convex structure provided on a surface thereof on a side toward a light-emitting surface of the device,
the concave-convex structure includes a plurality of concave portions having oblique surfaces and flat portions disposed around the concave portions, and
wherein at least one flat portion or concave portion has a size difference from at least one other flat portion or concave portion respectively, wherein said size difference is in one or more of a height thereof, and a depth thereof, the size difference being 0.62 times or larger than the center wavelength of emitted light.

8. The surface light source device according to claim 7, wherein
the organic electroluminescent element includes two or more electrode layers and the luminescent layer that is disposed between the electrode layers and emits light when a voltage is applied from the electrode layers, and
each of the two or more electrode layers is a layer consisting of a transparent electrode.

* * * * *